United States Patent

Maruyama et al.

[11] Patent Number: 5,832,595
[45] Date of Patent: Nov. 10, 1998

[54] METHOD OF MODIFYING CONDUCTIVE LINES OF AN ELECTRONIC CIRCUIT BOARD AND ITS APPARATUS

[75] Inventors: Shigenobu Maruyama; Mikio Hongo; Haruhisa Sakamoto; Tateoki Miyauchi; Ryohei Satoh, all of Yokohama; Kiyoshi Matsui, Hadano; Shinichi Kazui, Hadano; Kaoru Katayama, Hadano; Hiroshi Fukuda, Hadano, all of Japan

[73] Assignee: Hitachi, Ltd., Tokyo, Japan

[21] Appl. No.: 260,382

[22] Filed: Jun. 14, 1994

[30] Foreign Application Priority Data

Jun. 15, 1993 [JP] Japan .................................. 5-143248
Sep. 3, 1993 [JP] Japan .................................. 5-219528

[51] Int. Cl.$^6$ ..................................................... H05K 3/00
[52] U.S. Cl. ..................... 29/829; 29/402.01; 29/402.09; 228/56.3; 427/96
[58] Field of Search ........................ 29/829, 846, 402.01; 228/56.3; 427/96

[56] References Cited

U.S. PATENT DOCUMENTS

| | | | |
|---|---|---|---|
| 4,630,355 | 12/1986 | Johnson | 29/829 X |
| 4,683,652 | 8/1987 | Hatfield | 29/402.01 X |
| 5,063,660 | 11/1991 | Fiedelius | 228/56.3 X |
| 5,289,632 | 3/1994 | Chalco et al. | |
| 5,384,953 | 1/1995 | Economikos et al | 29/402.01 X |

FOREIGN PATENT DOCUMENTS

| | | |
|---|---|---|
| 58-173835 | 10/1983 | Japan . |
| 2-153591 | 6/1990 | Japan ..................................... 29/840 |

(List continued on next page.)

OTHER PUBLICATIONS

IBM Tech Disclosure Bull. vol. 9 No. 4, Sep. 1966 p. 370, by H. E. Luhn.

S.K. Ray et al, "Engineering Change (EC) Technology for Thin Film Metallurgy on Polyimide Films", 40th ECTC Proceedings, pp. 395–400, 1990.

(List continued on next page.)

Primary Examiner—Carl J. Arbes
Attorney, Agent, or Firm—Fay, Sharpe, Beall, Fagan, Minnich & McKee

[57] ABSTRACT

A method of modifying an electronic circuit board by performing disconnection or connection of conductive lines at a specified or an arbitrary position of the conductive lines of the electronic circuit board thereby changing an electric circuit and of completely modifying an open pattern defect of the conductive lines or an insulator layer, and its device, wherein a first energy beam is irradiated to portions of repair terminals 9 and 9' which are intended to connect or disconnect, of conductive lines 5 and 5' in the electronic circuit board thereby removing a protection layer, making windows and exposing the terminals 9 and 9' for connection; a second energy beam is irradiated thereby disconnecting the repair terminals 9 and 9', or a metal piece for connecting is supplied to between the repair terminals 9 and 9' and applying an energy thereto thereby electrically connecting them; and the disconnected or connected windowed portion is locally coated with the insulator layer thereby modifying the conductive lines of the electronic circuit board.

Further, windows 311 or 311' is formed in an insulating protection layer 310 on a conductive line connecting portion 308 formed in a couple or a conductive line disconnecting portion 309, a conductive line of the conductive line disconnecting portion is disconnected or a liquid material 312 for connecting conductive lines is supplied to the conductive line connecting portion 308, a metal layer 313 is precipitated by heating the liquid material 312 thereby connecting the conductive line connecting portion 308, and the window 311 or 311' is coated with an organic insulator layer.

7 Claims, 16 Drawing Sheets

FOREIGN PATENT DOCUMENTS

| | | | |
|---|---|---|---|
| 4-56384 | 2/1992 | Japan | 29/829 |
| 4-277692 | 10/1992 | Japan . | |
| 5-152726 | 6/1993 | Japan | 29/402.09 |
| 5-183257 | 7/1993 | Japan | 29/402.09 |
| 5-206619 | 8/1993 | Japan . | |
| 5-211385 | 8/1993 | Japan | 29/829 |

OTHER PUBLICATIONS

R.F. Miracky, "Selective–Area Laser–Assisted Processing for Microelectronic Multi–Chip Interconnect Applications", Material Research Society Symposium Proceeding, vol. 129, pp. 547–558, 1989.

A. Yabe, "Laser Chemical Processing", International Laser/Application Seminar–Micromachining, pp. 15–33, 1991. (in Japanese).

FIG. 13a-(1) 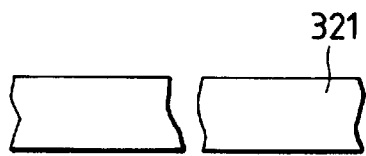
FIG. 13a-(2) 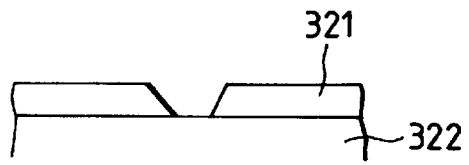
FIG. 13b-(1) 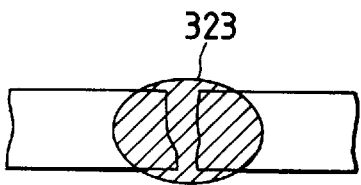
FIG. 13c-(1) 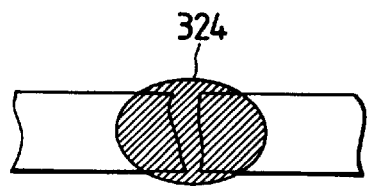
FIG. 13b-(2) 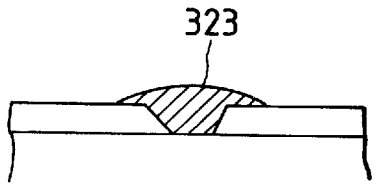
FIG. 13c-(2) 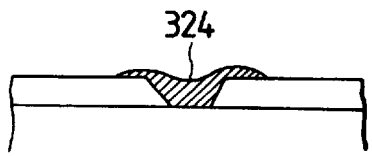

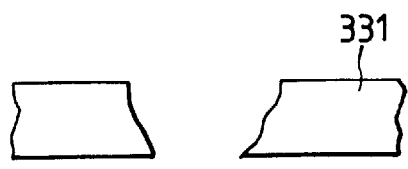
FIG. 14a-(1)
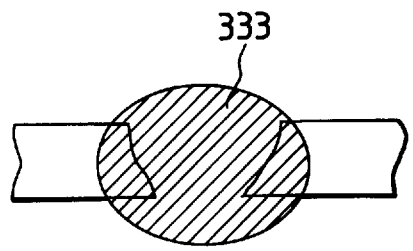
FIG. 14b-(1)
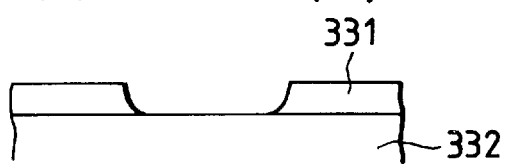
FIG. 14a-(2)
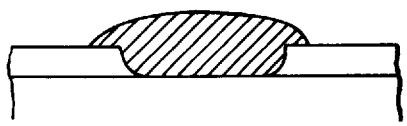
FIG. 14b-(2)
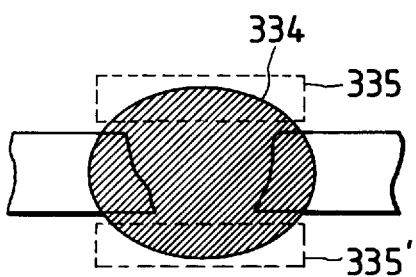
FIG. 14c-(1)
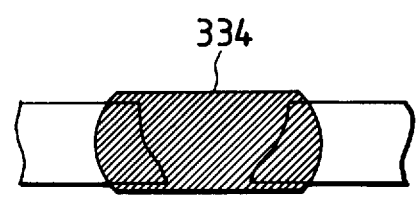
FIG. 14d-(1)
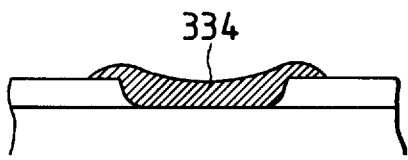
FIG. 14c-(2)
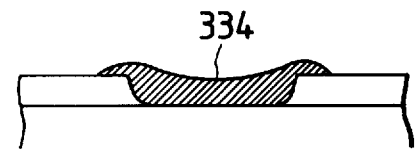
FIG. 14d-(2)

FIG. 15a-(1)
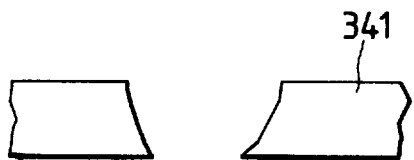
FIG. 15b-(1)
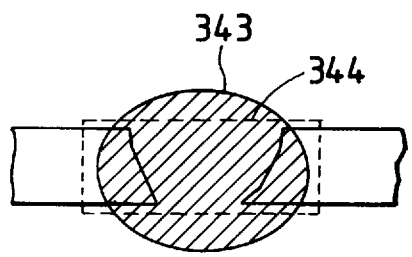
FIG. 15a-(2)
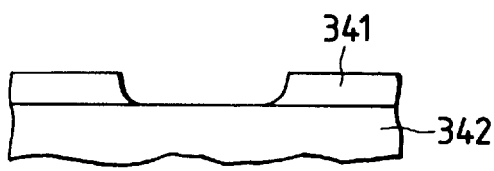
FIG. 15b-(2)
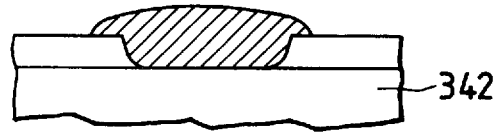
FIG. 15c-(1)
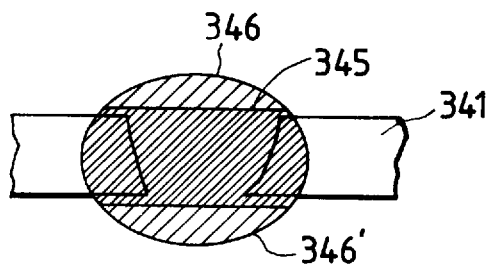
FIG. 15d-(1)
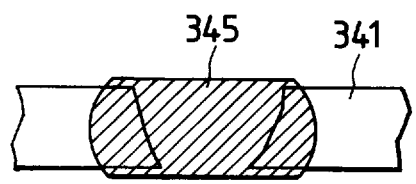
FIG. 15c-(2)
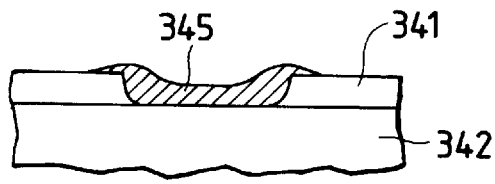
FIG. 15d-(2)
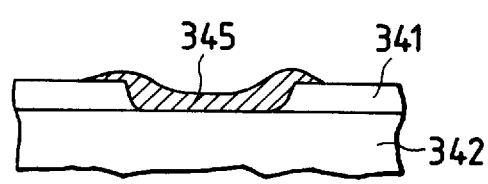

FIG. 16a-(1)
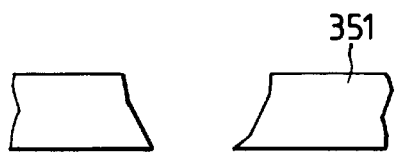
FIG. 16b-(1)
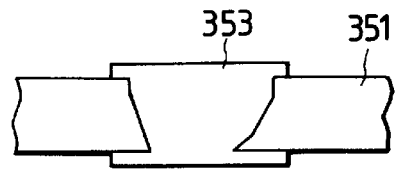
FIG. 16a-(2)
FIG. 16b-(2)
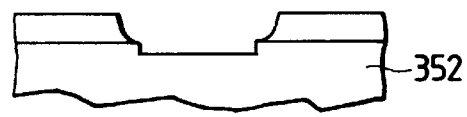
FIG. 16c-(1)
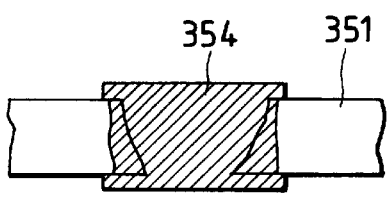
FIG. 16d-(1)
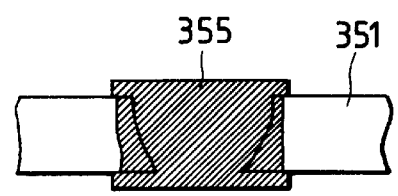
FIG. 16c-(2)
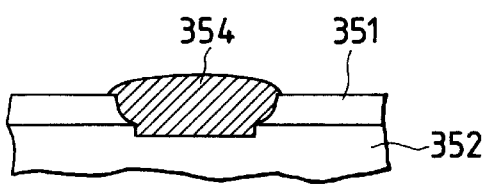
FIG. 16d-(2)
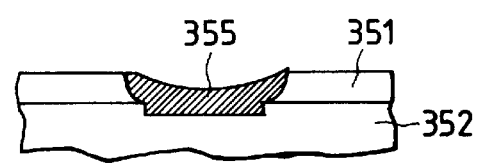

METHOD OF MODIFYING CONDUCTIVE LINES OF AN ELECTRONIC CIRCUIT BOARD AND ITS APPARATUS

BACKGROUND OF THE INVENTION

The present invention relates to a technology performing a connection between conductive lines or terminals in altering a circuit of conductive lines of an electronic circuit board, particularly to a method of modifying conductive lines of an electronic circuit board and its apparatus which disconnects partially conductive lines of a Multi Chip Module (MCM) board employed in a large-scale electronic instrument such as an electronic computer and enables a logic modification by connecting the conductive lines in use of a repair circuit, and a method of manufacturing an electronic circuit board mounted with LSI chips and its apparatus.

The alteration of these conductive lines is performed basically by removing (disconnecting) and adding (connecting) of portions of the conductive lines. Among these, the disconnecting is performed most pertinently by a method utilizing a laser beam machining, which has been discussed, for instance, in S. K. Ray et al., "Engineering Change (EC) Technology for Thin Film Metallurgy on Polyimide Films", 40th ECTC Proceedings, p. 395–400 (1990) etc.

On the other hand, with respect to the connection, a method by a wire bonding is shown in the above paper or a method utilizing a laser chemical vapor deposition (CVD) is shown in R. F. Miracky, "Selective-area Laser-assisted Processing for Microelectronic Multi-chip Interconnect Applications", Material Research Society Symposium Proceeding Vol. 129, p. 547–558 (1989).

Further, with respect to the modification of an insulator layer, a method utilizing a laser machining in removing a portion thereof is the most pertinent. For instance, ablation mechanism of an organic high polymer material by an excimer laser and the like are discussed in Akira Yabe "Laser Chemical Processing", International Laser/Application Seminar-Micromachining, p. 15–33 (1991).

On the other hand, with respect to the modification of an open pattern defect of an insulator layer, a method has been applied for a patent in Japanese Patent Laid-Open No. 173835/1983, wherein a resist is selectively coated on an open pattern defect on a board which is pre-baked, only extra portions of the coated resist are selectively exposed by using a mask, and are developed thereby performing the modification.

However, among the conventional technologies concerning the connection, in the former case, pads are necessary for the wire bonding which becomes a hazard in forming a successive conductive line layer except at the uppermost layer. In the latter case, the device is large-scaled and expensive since it needs a vacuum process.

Further, in the conventional technologies concerning the modification of the open pattern defect of the insulator layer, in removing the extra portions of the resist, another partial exposure and development are necessary by combining masks, and therefore an exclusive mask for the partial exposure is necessary, it is necessary to reverse the masks from the positive type resist to the negative type resist, and the steps of modification are prolonged.

SUMMARY OF THE INVENTION

It is an object of the present invention to provide a method of modifying conductive lines of an electronic circuit board and its apparatus which can be used not only in a disconnection defect due to a manufacturing process or a mistake in design of an electronic circuit board, but also to a circuit exchange for promoting the function.

It is an object of the present invention to provide a method of manufacturing an electronic circuit board mounted with LSI chips and its apparatus which enables a logic modification without enlarging the electronic circuit board, whereby conductive lines for repair are provided substantially in a region of the LSI chips, and which does not negatively influence on connecting portions thereof with the LSI chips by soldering or the like.

The above objects can be achieved by supplying a small piece composed of a metal film made of a material having a property at least having the electric conductivity and functioning as conductive lines and a property excellent in adhesiveness with respect to conductive lines of an electronic circuit board, to defect portions of the electronic circuit board, and by adhering it to the electronic circuit board.

BRIEF DESCRIPTION OF THE DRAWINGS

FIGS. 13a-(1), 13a-(2), 13b-(1), 13b-(2), 13c-(1) and 13c-(2) are plane views and sectional diagrams showing a method of connecting conductive lines on an electronic circuit board;

FIGS. 14a-(1), 14a-(2), 14b-(1), 14b-(2), 14c-(1), 14c-(2), 14d-(1) and 14d-(2) are plane views and sectional diagrams showing a second embodiment of a method of connecting conductive line;

FIGS. 15a-(1), 15a-(2), 15b-(1), 15b-(2), 15c-(1), 15c-(2), 15d-(1) and 15d-(2) are plane views and sectional diagrams showing a third embodiment of a method of connecting conductive lines;

FIGS. 16a-(1), 16a-(2), 16b-(1), 16b-(2), 16c-(1), 16c-(2), 16d-(1) and 16d-(2) are plane views and sectional diagrams showing a fourth embodiment of a method of connecting conductive lines;

DESCRIPTION OF THE PREFERRED EMBODIMENTS

Figure 1:
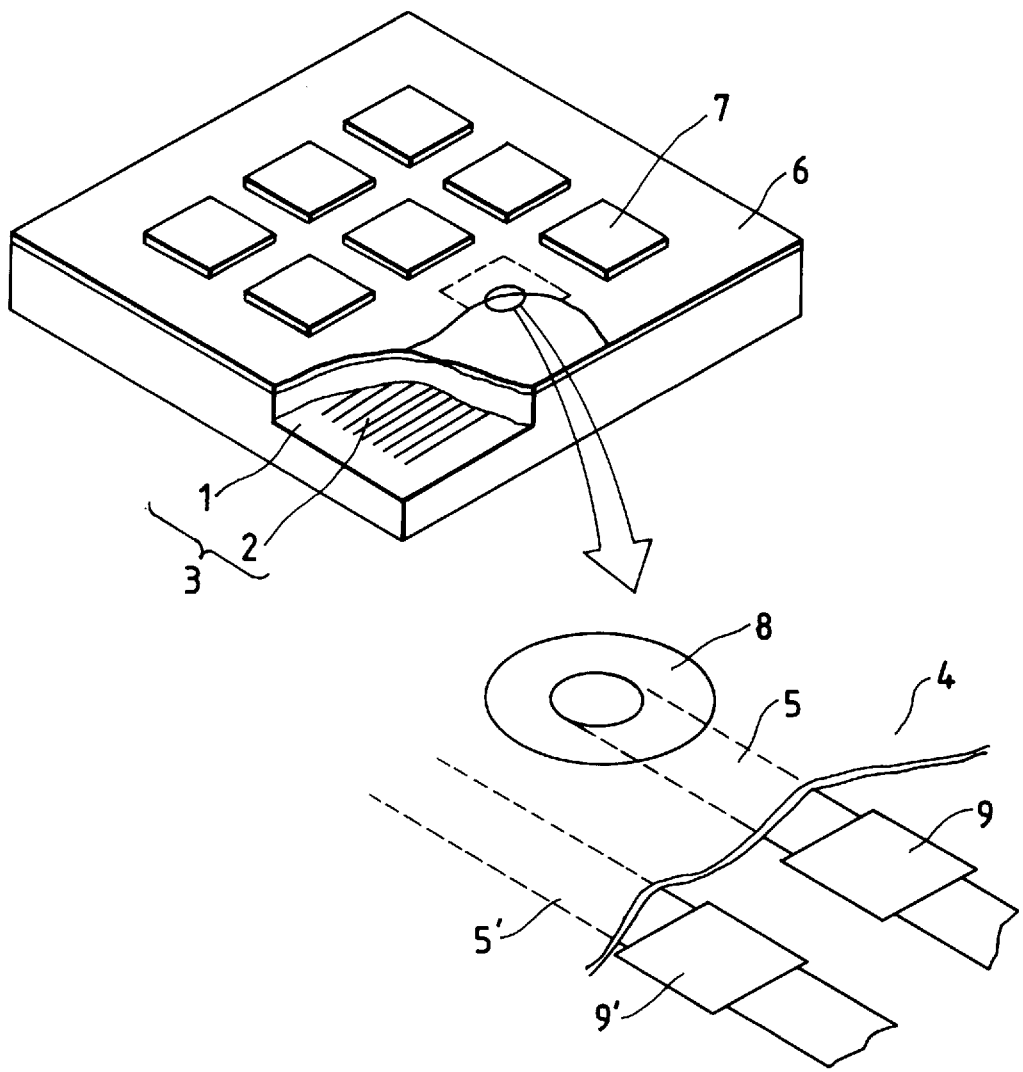
FIG. 1 is a construction diagram of an electronic circuit board which is an object of the present invention.

According to an aspect of the present invention, there is provided a method of modifying conductive lines of an electronic circuit board comprising the steps of:

supplying a rectangular piece of a metal film previously shaped in dimensions and a shape suitable for performing a connection to between portions of a connecting terminal at a portion in an electronic circuit board to be connected previously; and connecting the metal film to the portions of the connecting terminal by applying an energy to an interface of the portions of the connection terminal and the metal film thereby forming a conductive pass of connecting terminal-metal film-connecting terminal.

According to another aspect of the present invention, there is provided a method of modifying conductive lines of an electronic circuit board comprising the steps of:

exposing surfaces of portions of a connecting terminal by making a window by an energy beam such as a laser beam of an ultraviolet ray having a short wavelength on the portions of the terminal coated with a protection layer and to be connected previously in an electronic circuit board;

supplying a rectangular piece of a metal film previously shaped in dimensions and a shape suitable for performing a connection to between portions of the exposed connecting terminal; and connecting the portions of the connecting terminal to the metal film by applying an energy to an interface of the portions of the connecting terminal and the metal film thereby forming a conductive pass of connecting terminal-metal film-connecting terminal.

According to another aspect of the present invention, there is provided a method of modifying conductive lines of an electronic circuit board comprising the steps of:

exposing surfaces of portions of a connecting terminal by making a window by an energy beam such as a laser beam of an ultraviolet ray having a short wavelength on the portions of a terminal coated with a protection layer and to be connected previously in an electronic circuit board;

supplying a rectangular piece of a metal film previously shaped in dimensions and a shape suitable for performing a connection to between portions of the exposed connecting terminal;

connecting the portions of the connecting terminal and the metal film by applying an energy to an interface of the portions of the connecting terminal and the metal film thereby forming a conductive pass of connecting terminal-metal film-connecting terminal; and coating the connected rectangular piece of the metal film and a surrounding thereof with a heat resistant organic protection layer.

According to another aspect of the present invention, there is provided the method of modifying conductive lines of an electronic circuit board according to the above aspects, wherein the rectangular piece of the metal film for performing the connection is formed by a single layer of a metal or aluminum.

According to another aspect of the present invention, there is provided the method of modifying conductive lines of an electronic circuit board according to the above aspects, wherein the rectangular piece of the metal film for performing the connection comprises at least two layers of a first electrically conductive metal having a low resistance and a second electrically conductive metal having a good adhesive property.

According to another aspect of the present invention, there is provided the method for modifying conductive lines of an electronic circuit board according to the above aspects, wherein the supplying step is constructed to select and supply the rectangular piece of the metal film.

According to another aspect of the present invention, there is provided a method of manufacturing an electronic circuit board mounted with LSI chips comprising:

a step of removing an LSI chip at a portion on an electronic circuit board which operates erroneously in a state wherein a connecting terminal and the LSI chip are connected, said electronic circuit board being formed with desired conductive lines and conductive lines for repair which are coated with a protection layer; and a step of disconnecting wherein a first energy beam such as a laser beam of an ultraviolet ray having a short wavelength is irradiated to a portion of the connecting terminal to be disconnected in a region removed of the LSI chip in the step of removing thereby removing the protection layer, making a window and exposing the connecting terminal; the conductive lines for repair are disconnected by irradiating and scanning a second energy beam such as a focused ultraviolet laser beam or a high brightness ion beam irradiated from a liquid metal ion beam or a shaped energy beam under first conditions different from second conditions for the first energy beam; and the disconnected and windowed portion is locally coated with an insulator layer.

According to another aspect of the present invention, there is provided a method of manufacturing an electronic circuit board mounted with LSI chips comprising:

a step of removing an LSI chip at a portion on an electronic circuit board which operates erroneously in a state wherein a connecting terminal and the LSI chip are connected, said electronic circuit board being formed with desired conductive lines and conductive lines for repair which are covered with a protection layer;

a step of connecting wherein an energy beam is irradiated to a portion for connecting in a region removed with the LSI chip in the step of removing thereby removing the protection layer, making a window and exposing the connecting terminal; a metal film suitable for connecting is previously supplied to between portions of the exposed connecting terminal; an energy is applied thereto thereby forming a conductive pass of connecting terminal-metal film-connecting terminal; and the connected and windowed portion in locally coated with an insulator layer; and a step of reconnecting the LSI chip to the connecting terminal on the electronic circuit board of which conductive lines are modified by the disconnecting step and the connecting step.

According to another aspect of the present invention, there is provided a method of manufacturing an electronic circuit board mounted with LSI chips comprising:

a step of removing an LSI chip at a portion on an electronic circuit board which operates erroneously in a state wherein a connecting terminal and the LSI chip are connected, said electronic circuit board being formed with desired conductive lines and conductive lines for repair which are covered with a protection layer; and a step of disconnecting wherein a first energy beam is irradiated to a portion of the connecting terminal to be disconnected in a region removed of the LSI chip in the step of removing thereby removing the protection layer, making a window and exposing the connecting terminal; the conductive lines for repair are disconnected by irradiating a second energy beam under first conditions different from second conditions for the first energy beam; and the disconnected and windowed portion is locally coated with an insulator layer;

a step of connecting wherein the first energy beam is irradiated to a portion for connecting in a region removed with the LSI chip in the step of removing thereby removing the protection layer, making a window and exposing the connecting terminal; a metal film suitable for connecting is previously supplied to between portions of the exposed connecting terminal; an energy is applied thereto thereby forming a conductive pass of connecting terminal-metal film-connecting terminal; and the connected and windowed portion is locally coated with an insulator layer; and a step of reconnecting the LSI chip to the connecting terminal on the electronic circuit board of which conductive lines have been modified by the disconnecting step and the connecting step.

According to another aspect of the present invention, there is provided an apparatus for modifying conductive lines of an electronic circuit board comprising:

supplying means for previously supplying a metal film suitable for connecting to between portions of a connecting terminal which are to be connected previously; and connecting means for connecting the portions of the connecting terminal and the metal film by forming a conductive pass of connecting terminal-metal film-connecting terminal by applying an energy to an interface of the portions of the connecting terminal and the metal film.

According to another aspect of the present invention, there is provided an apparatus for modifying conductive lines of an electronic circuit board comprising:

exposing means for exposing a surface of a connecting terminal of a portion of an electronic circuit board coated with a protection layer and to be connected previously by making a window on the terminal;

supplying means for supplying a rectangular piece of a metal film formed in dimensions and a shape suitable for previously connecting to between portions of the connecting terminal exposed by the exposing means; and connecting means for connecting the metal film supplied by the supplying means to the portions of the connecting terminal by forming a conductive pass of connecting terminal-metal film-connecting terminal by applying an energy to an interface of the metal film and the portions of the connecting terminal.

According to another aspect of the present invention, there is provided an apparatus for modifying conductive lines of an electronic circuit board comprising:

exposing means for exposing a surface of a connecting terminal by making a window on a portion of an electronic circuit board coated with a protection layer and to be connected previously;

supplying means for supplying a rectangular piece of a metal film formed in dimensions and a shape suitable for previously connecting to between portions of the connecting terminal exposed by the exposing means;

connecting means for connecting the metal film supplied by the supplying means to the portions of the connecting terminal by forming a conductive pass of connecting terminal-metal film-connecting terminal by applying an energy to an interface of the metal film and the portions of the connecting terminal; and coating means for coating the rectangular piece of the metal film connected by the connecting means and a surrounding thereof with a heat resistant organic protection layer.

According to another aspect of the present invention, there is provided the apparatus for modifying conductive lines of an electronic circuit board according to the above aspects, wherein the supplying means is constructed to select and supply the rectangular piece of the metal film.

According to another aspect of the present invention, there is provided an apparatus for manufacturing an electronic circuit board mounted with LSI chips comprising:

disconnecting means wherein a first energy beam is irradiated to a portion of a connecting terminal to be disconnected in a region removed of an LSI chip at a portion on an electronic circuit board which operates erroneously in a state wherein the connecting terminal and the LSI chip are connected, said electronic circuit board being formed with desired conductive lines and conductive lines for repair which are covered with a protection layer thereby removing the protection layer, making a window and exposing the connecting terminal; the conductive line for repair is disconnected by irradiating a second energy beam under first conditions different from second conditions for the first energy beam; and the disconnected and windowed portion of the connecting terminal is locally coated with an insulator layer; and connecting means wherein the first energy beam is irradiated to a portion of the connecting terminal in the region removed of the LSI chip thereby removing the protection layer, making a window and exposing the connecting terminal; a conductive pass of connecting terminal-metal film-connecting terminal is formed by previously supplying a metal film suitable for performing a connection to between portions of the exposed connecting terminal and by applying an energy thereon; and the connected and windowed portion is locally coated with an insulator layer; and LSI chip connecting means for reconnecting the LSI chip to the connecting terminal of the electronic circuit board of which conductive lines are modified by the disconnecting means and the connecting means.

According to another aspect of the present invention, there is provided an apparatus for modifying conductive lines of an electronic circuit board comprising:

stage means for holding and moving an electronic circuit board;

energy applying means for applying an energy on a rectangular piece of a metal film by holding the rectangular piece of the metal film at a portion of conductive lines of an electronic circuit board to be connected, by positioning the electronic circuit board by a relative movement and by supplying the rectangular piece of the metal film to the portion of the conductive lines to be connected; and observing means for observing a surface of the electronic circuit board.

According to another aspect of the present invention, there is provided the apparatus for modifying conductive lines of an electronic circuit board according to the above aspect further comprising:

energy beam irradiating means for irradiating an energy beam for forming a window for exposing conductive lines in the electronic circuit board coated with the organic protection layer; and coating means for coating the window with the organic protection layer by supplying locally a material of the organic protection layer such that the material does not reach a portion of the connecting terminal for connecting to an LSI chip.

According to another aspect of the present invention, there is provided a method of modifying conductive lines of an electronic circuit board comprising the steps of:

supplying a liquid material for connecting conductive lines in an electronic circuit board to a previously provided connecting portion of the conductive lines;

heating the liquid material; and precipitating a metal layer on the connecting portion of the conductive line thereby connecting the conductive lines.

According to another aspect of the present invention, there is provided a method of modifying conductive lines of an electronic circuit board comprising the steps of:

supplying a liquid material for connecting conductive lines to an open pattern defect of conductive lines in an electronic circuit board;

heating the liquid material; and precipitating a metal layer on the open pattern defect of the conductive lines thereby connecting the conductive lines.

According to another aspect of the present invention, there is provided a method of modifying conductive lines of an electronic circuit board comprising the steps of:

supplying a liquid organic insulating material to an open pattern defect of an insulator layer;

heating the liquid material; and curing the liquid material thereby modifying the open pattern defect of the insulator layer.

According to another aspect of the present invention, there is provided an apparatus for modifying conductive lines of an electronic circuit board comprising:

a mechanism for holding and moving an electronic circuit board;

means for supplying a liquid material or a liquid organic insulating material for connecting conductive lines onto an electronic circuit board; and means for observing a surface of the electronic circuit board.

In large-scale electronic instruments of which representative is an electronic computer, with the magnification of their scales, the magnification of the employed substrate and further the higher density thereof by a multi-layer formation and a miniaturized formation of wirings or conductive lines, are promoted.

The prolongation of development time period in their development stages and the lowering of yield in their mass production stages, are inevitable.

In the mean time, in an electronic circuit board which is trially manufactured in the development stages, a number of failures due to a disconnection, short circuiting or the like due to the manufacturing process, or due to a mistake in design, are generally caused.

These failures are discovered in a visual inspection in the manufacturing steps or by a characteristic evaluation of a finished product, all of which need modification. Further, even if the substrate is finished as originally designed, there causes a change of design wherein the circuit wiring needs to modify. This invention achieves these modifications by the above construction.

More specifically, firstly, a metal selected from the group consisting of Cu, Ni, W, Ta, Al and the like which is a material having at least electrical conductivity and functioning as a conductive line, and a solder material selected from the group consisting of Pb—Sn, Sn—Ag, Au—Ge and the like, which is an electrically conductive material having an adhesive property, are formed in a layers structure which is divided in rectangular pieces, or a film of a metal selected from the group consisting of Au, Al and the like which is excellent both in electrical conductivity and adhesive property, is divided in rectangular pieces. The rectangular piece is supplied to a portion that needs a connection by a handling mechanism. In the former case, the rectangular piece is placed such that a face thereof to be soldered contacts the conductive lines of an electronic circuit board, which is heated by a heating means thereafter, thereby performing the soldering. In the latter case, the rectangular piece is supplied to a portion that needs a connection by a handling mechanism irrespective of either one of its both faces. In this operation, the gold film face is placed as contacting the conductive lines of the electronic circuit board, and ultrasonically connected by pressing an ultrasonic tool to a connecting member, while heating it if necessary. There is another method wherein the soldering is performed by putting them into a reflowing furnace. In short, the connection of a connecting terminal and a metal film can be achieved by contacting them while feeding an energy to their adhering faces.

Secondary, at a portion of circuit exchange of an electronic circuit board, an excimer laser is irradiated to a conductive line disconnecting portion, whereby the conductive line made of Al, Cu, Ni, Cr, Au, Mo, W or the like or a composite film of these, is disconnected, and a metal complex solution is supplied to a conductive line connecting portion wherein trifluoroacetic acid palladium ($Pd(CF_3OO)_2$) is dissolved in a solvent such as acetonitrile and N-methylpyrrolidone by using a micro-dispenser. Thereafter, the metal complex solution is heated, only the solvent is evaporated, the complex is decomposed and a metal layer is precipitated on the conductive line connecting portion. Or, an ultra-fine particle dispersion solution wherein a metal paste of copper or the like or ultra-fine metallic particles of gold or the like are dispersed in a solvent of α-terpineol or the like is supplied to the conductive line connecting portion by a micro-dispenser which is heated, only the solvent is evaporated and the metal layer is precipitated thereby electrically connecting the conductive line connecting portion.

Further, with respect to an open-circuit defect of an insulator layer, an ultraviolet (UV) curing resin is supplied to the defect portion by employing a micro-dispenser, and the supplied UV curing resin is cured by irradiating an ultraviolet ray. Or an epoxy resin or a polyimide resin or the like is supplied thereto by a micro-dispenser which is heated and cured thereby performing the modification.

As explained as above, the method of modifying conductive lines of an electronic circuit board and its device according to this invention, are applicable not only to a disconnection failure due to the manufacturing process or the design mistake of the electronic circuit board, but to the circuit exchange for promoting the function.

Further, the method of manufacturing an electronic circuit board mounted with LSI chips and its device can perform a logic modification without enlarging the electronic circuit board, by providing conductive lines for repair substantially in regions of the LSI chips without negatively influencing on portions for connecting to the LSI chips by soldering or the like.

A specific explanation will be given of a first embodiment of a method of connecting of this invention in reference to the drawings as follows.

FIG. 1 shows an electronic circuit board which is an object of the method for connecting conductive lines according to the present invention. On a thick film substrate 3 which is composed of a plurality of cured conductive line layers 2 that are formed by alumina-ceramic 1 and a thick film paste, a plurality of thin film layers 6 wherein a polyimide layer composes an insulator layer 4 and a copper layer or aluminum layer composes a wiring layer 5, on which electrodes 8 are formed for connecting those to the LSI chips 7 by a controlled collapsed bonding (CCB). Terminals 9 and 9' for connecting are formed on the circuit board, which are prepared for the circuit exchange. The terminals 9 and 9' for connecting are formed in a step of forming the thin film conductive lines 5 and 5' (the material is selected from Cu, Al, Ni, W, Ta and the like), or a step of forming the connecting terminals 8 for the CCB soldering (the material is selected from the constructions of Au/Ni, Au/Cu/Cr and the like). These terminals 9 and 9' for connecting are coated with an insulating protection layer 4 of polyimide or the like to prevent an undesirable bridge formation in the CCB soldering.

Figure 2:
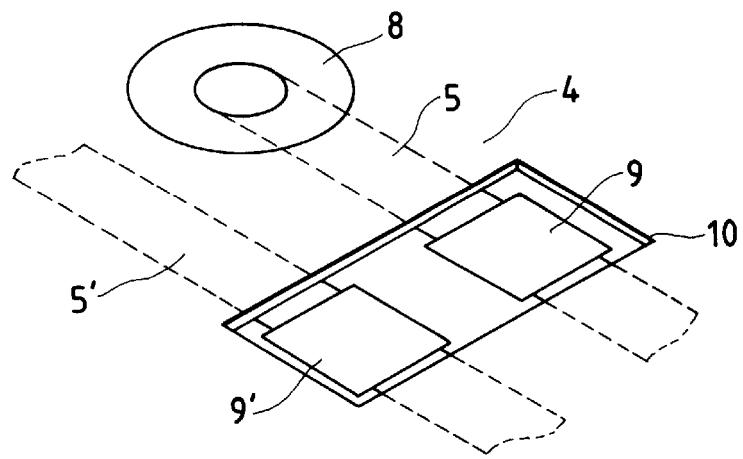
FIG. 2 is a perspective view showing a connecting terminal portion which is exposed by forming a window in a protection layer.

In case wherein the specified terminals 9 and 9' for connecting need to be connected for some reason (in case of discovering a failure by inspection, or in case of necessitating a design change, etc.), the solder for the CCB soldering is molten by locally heating the LSI chip 7 on the connecting terminal, and the LSI chips 7 is removed. (When the connecting terminal is not under the LSI chip 7 and the connection can be performed without removing the LSI chip 7, the chip may remain as it is). Thereafter, as shown in FIG. 2, a partial removed area (window) 10 is formed on the polyimide layer 4 on the terminals for connecting 9 and 9' by an ablation by an energy beam such as an excimer laser, thereby exposing the terminals for connecting 9 and 9' on the inner bottom face of the window 10.

Figure 3:
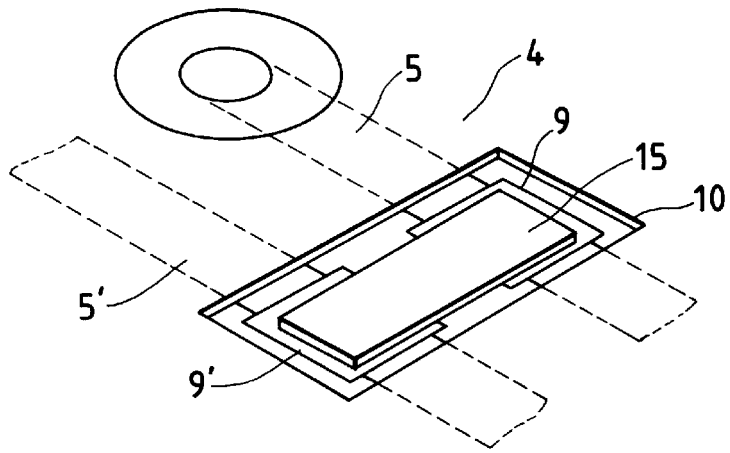
FIG. 3 is a perspective view showing a connecting terminal portion in which a metal piece for connection is supplied to between connecting terminals.

Next, a connecting piece 15 is supplied to the window 10 as shown in FIG. 3. The connecting piece 15 is provided with, for instance, a one-layer structure of a gold film or a two-layer structure of a copper film and a solder which is divided in pieces. In this embodiment, an explanation will be given of a case of using a piece having a two-layer structure of a copper film and a solder. A material is selected to the solder which is wettable to the terminals for connecting 9 and 9'. A solder material of Sn—Pb, Sn—Ag, Au—Ge or the like can be employed when the surfaces of the terminals for connecting 9 and 9' are made of Cu, Au, Ni or the like. The piece is adsorbed at the front end of a tool having a mechanism of holding it by a vacuum adsorption or an electrostatic adsorption, and is supplied to the window 10 wherein the terminals 9 and 9' that need connection are exposed such that the solder layer contacts the terminals for connecting 9 and 9'. Thereafter, the tool holding the piece 15 for connecting is heated by a heater. In this operation, the heating temperature is fed to a temperature sufficiently melting the solder. In this way, the copper film is soldered to the terminals for connecting 9 and 9'. Or, in case of applying an ultrasonic wave to the tool, the heating temperature may be lower than the temperature of melting the solder. The electronic circuit board may be heated if necessary, in a range whereby the electronic circuit board is not negatively influenced.

Figure 4:
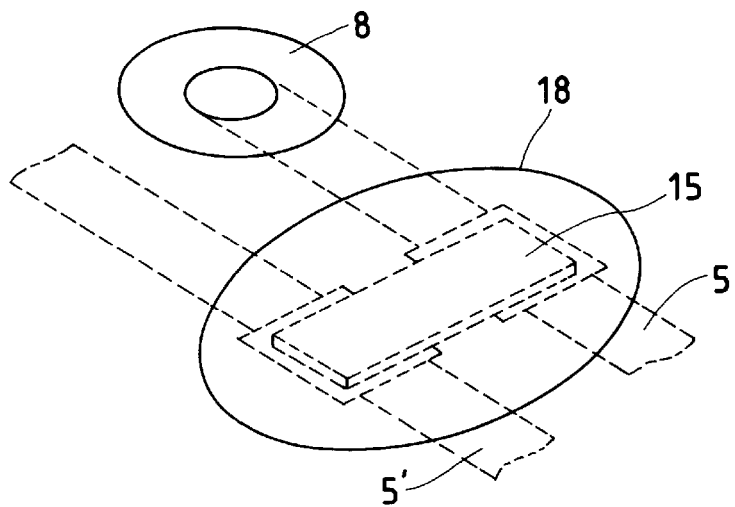
FIG. 4 is a perspective view showing a connecting terminal portion which is formed with a protection layer after finishing a connection.

Next, the connected portion is moved under a nozzle supplying a fine droplet 18 of a polyimide material or the like, for instance as shown in FIG. 4, and the fine droplet 18 of a polyimide material or the like is dripped on the surface of the connected portion and covers it so that at least the metal portion is not exposed. Thereafter, this electronic circuit board is heated in a furnace in a temperature range whereby the circuit wirings or the mounted parts are not negatively influenced, or the board is locally heated by a laser beam, an infrared-ray lamp or the like thereby polymerizing the polyimide material. This polyimide layer 18 can not only prevent a shortcircuit from causing by bridging in connecting the LSI chip by the CCB bonding, but provide the reliability. This operation is performed by the number of connected portions if necessary.

Figure 5A:
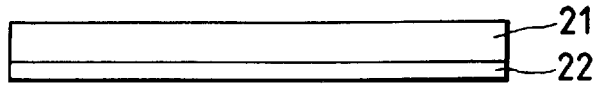
FIGS. 5(a), 5(b), 5(c), 5(d), 5(e) and 5(f) show sectional diagrams indicating metal pieces for connection.

As for the piece 15 for connecting, an explanation has been given to the piece that is formed only by a film of gold, alumina or the like, or the piece 15 having a two-layer structure of the copper film 21 and the Sn—Pb solder 22, as shown in the sectional diagram of FIG. 5(a). Other than this, the small pieces 15 having structures shown in FIGS. 5(b), 5(c), 5(d), 5(e) and 5(f) can be employed.

Figure 5B:
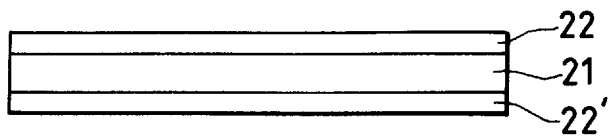
Figure 5C:
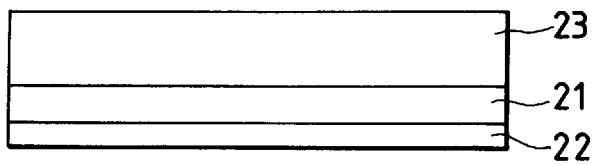
Figure 5D:
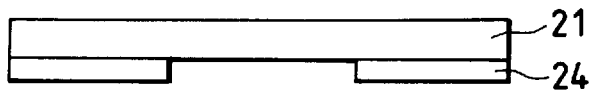
Figure 5E:
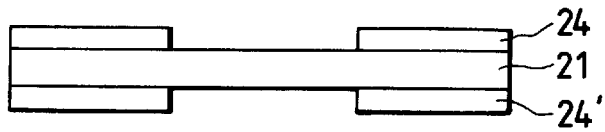
Figure 5F:
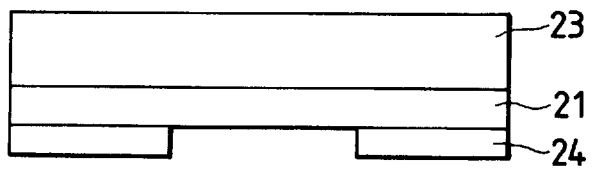

FIG. 5(b) shows a piece having a three-layer structure wherein the Sn—Pb solder 22 and 22' are formed on both faces of a film 21 of an electrically conductive metal, for instance, copper by a method of electric plating or the like, which has an advantage of dispensing with the differentiation between top and bottom faces thereof in using it. FIG. 5(c) shows a three-layer structure wherein a copper layer 21 is adhered to an organic material film 23 having heat resistance such as polyimide, on which a solder layer 22 of Sn—Pb or the like is coated by electric plating or the like, which has an advantage of dispensing with the coating of a polyimide to a very small region as stated above. Further, FIG. 5(d) shows a structure wherein a solder layer 24 is formed on both ends of one face of the copper film 21, FIG. 5(e) shows a structure wherein the solder layers 24 are formed on both faces of the copper film 20, and FIG. 5(f) shows a structure wherein the solder layer 24 is formed on both ends of the copper layer 21 that is adhered to the organic material layer 23. In the above three examples, unnecessary solder is eliminated as much as possible.

Further, the polyimide layer 18 as shown in FIG. 4 is formed to insulate the connected portion. However, this invention is not restricted to this example. A material may be used which can prevent the bridge formation with the CCB solder and which can stand a temperature in mounting the LSI chips, and an epoxy resin, a phenol resin or an ultraviolet curing resin or the like can be employed. In case of the ultraviolet curing resin, the resin has an effect whereby it can be cured only by irradiating an ultraviolet ray and can be treated without thermally influencing on the other portions.

On the other hand, when a connection is necessary, the connecting terminal (CCB bump 8) for connecting to the LSI chip needs to separate from an originally connected circuit. In that case, the separation can be performed by a laser beam irradiation. A window having an area larger than the dimensions of a conductive line to be disconnected is formed in the polyimide film on the conductive line by ablation by an energy beam such as an excimer laser, and thereafter, an energy beam such as an excimer laser, the dimensions of which is set to the dimensions of the conductive lines to be disconnected is irradiated thereto thereby performing the disconnection. The disconnected portion may remain as it is. However, to promote the reliability, it is more desirable to form a protection layer by dripping a droplet of a polyimide material or other resins on the disconnected portion and by heating it thereby polymerizing or curing the resin.

An explanation has been given to the case wherein an excimer laser is employed as a laser beam for removing the polyimide layer or disconnecting the conductive line. However, this invention is not restricted to this example. Other than representative excimer laser beams having wavelengths of 308 nm, 248 nm and 193 nm, a laser beam which can oscillate a wavelength having an energy that can disconnect the bonding of an organic material layer of a polyimide or the like, such as the third- or fourth-harmonic generate of an YAG laser, the second-harmonic generate of a ruby laser or the like, can be employed. The disconnection can be performed by scanning and irradiating a focused ion beam irradiated from a high brightness ion source such as a liquid metal ion source. In short, a necessary removal processing may be performed without causing damage to the surrounding by selecting pertinent ranges of the wavelength and an energy density.

The most desirable method of irradiating laser is a system of projecting a rectangular aperture provided in a laser beam path. However, the laser may be converged in a circular spot, or a necessary area may be removed by scanning a very fine spot.

After the disconnection and the connection necessary for the circuit exchange have been finished, the circuit exchange is completed by remounting the removed LSI chip 7.

Figure 6:
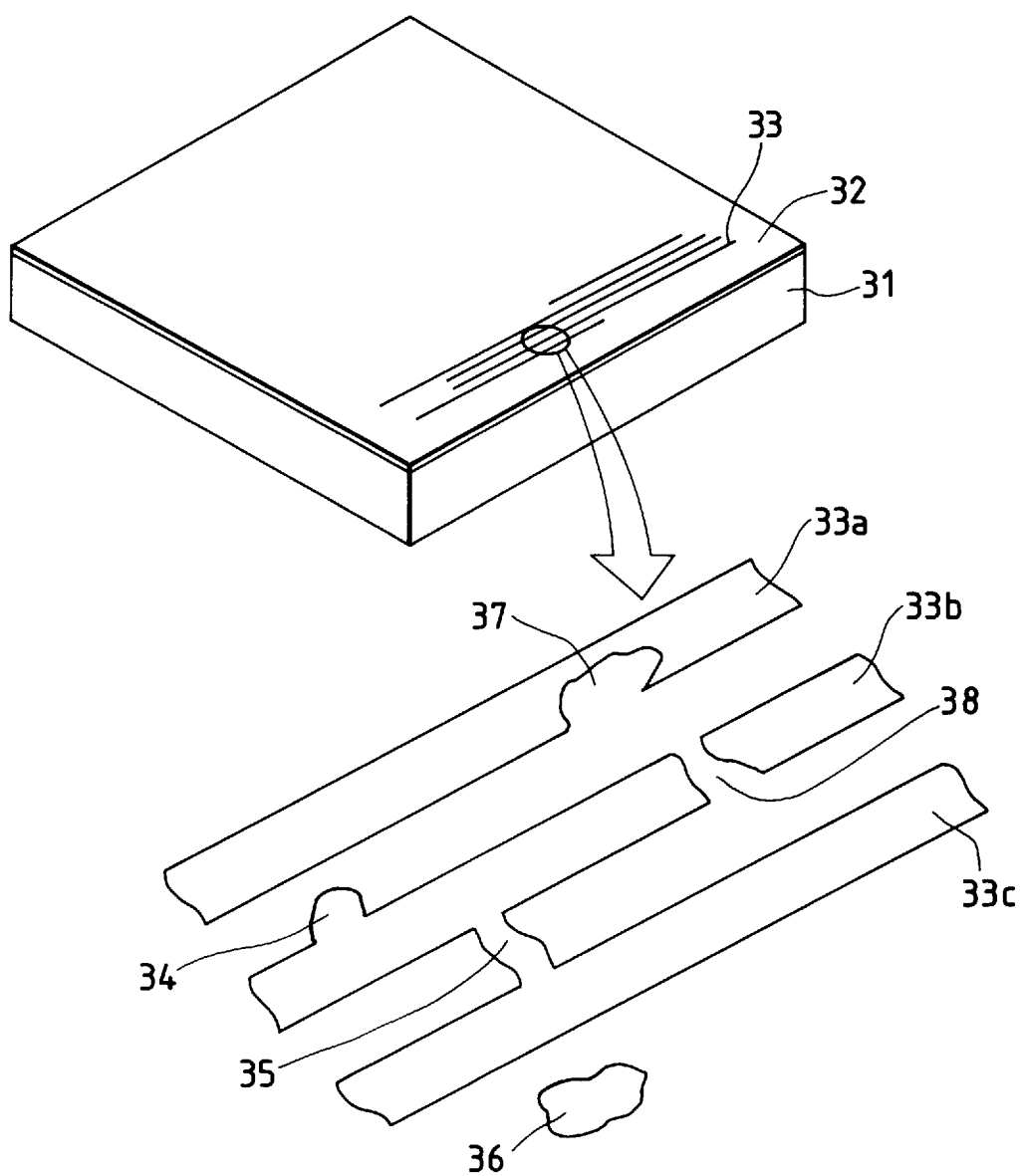
FIG. 6 is a diagram for explaining defects of an electronic circuit board which is another object of the present invention.

Next, an explanation will be given of a connecting method which is another embodiment of the present invention. FIG. 6 shows a state before completing the electronic circuit boards mentioned above, that is, a state wherein the conductive line layer 33 of a metal thin film is formed on the thick film substrate 31 with the polyimide layer as an insulator layer 30. As the material of the conductive line layer 33, a metal of Cu, Al, Ni, W, Mo or the like or a composite layer of these can be adopted. There are defects (short pattern defect) 34, 35 and 36 wherein an extra metal layer is present in the conductive line layer 33, or defects (open pattern defect) 37 and 38 wherein a portion of conductive line is deficient. Since normally a plurality of conductive line layers are formed when a board is finished while including the defects, the board is a failure or is undesirable even if it is not a failure. Accordingly, it is necessary to modify these defects for each conductive line layer.

Among these defects, with respect to short pattern defects 34, 35 and 36, they can be removed by irradiating, for instance, an excimer laser. In this operation, the laser is not restricted to an excimer laser and is selected from a pulse laser having a wavelength from a near infrared ray to an ultraviolet ray in view of processing the metal thin film. The representative ones are a fundamental wave of an YAG laser and its harmonic generates, a glass laser, a ruby laser, a XeCl laser, a KrF laser, an ArF laser and the like.

Figure 7:
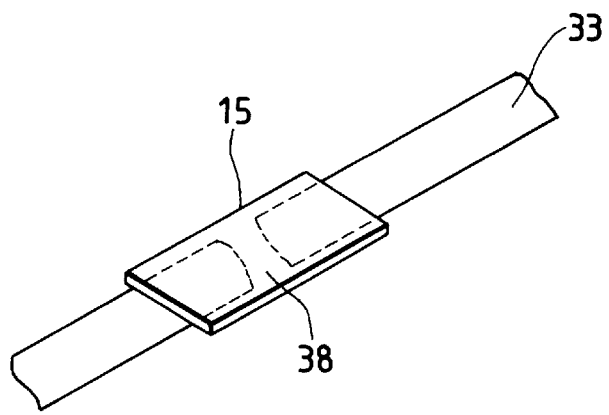
FIG. 7 is a perspective view showing a disconnecting portion of conductive line of an electronic circuit board which is supplied with a metal piece for connection.

On the other hand, the open pattern defects 37 and 38 are modified by the following procedure. First, a piece for connecting 15 is supplied to the defect 38 as shown in FIG. 7. In this operation, the piece for connecting 15 has a two-layer structure of a copper film and a solder which is divided in pieces. As the solder, a solder wettable to the material of the conductive line 33 is selected. When the surface of the conductive line is made of Cu, Au, Ni or the like, a solder material of Sn—Pb, Sn—Ag, Au—Ge or the like can be employed. The piece is adsorbed at the front end of a tool having a mechanism of holding it by a vacuum adsorption or an electrostatic adsorption, and is supplied to conductive lines 33 at both ends of the defect 38 that needs a connection such that the solder layer contacts the conductive lines 33.

Thereafter, the tool holding the piece 15 for connecting is heated by a heater. The heating temperature in this operation is set to a temperature sufficiently melting the solder. In this way, the copper film is soldered to the both ends of the defect 38. In case of applying an ultrasonic wave to the tool, the heating temperature may be lower than the temperature for melting the solder. The total board may be heated in a range that does not adversely influence on the board, if necessary.

In this operation, a solder is selected which has a melting point lower than the heat resistant temperature of the conductive lines and the interlayer insulator films and higher than a temperature that is applied in later steps. In this embodiment, different from the first embodiment, the length to be connected is not constant. Therefore, a plurality of pieces for connecting 15 should be prepared. A piece is selected among these and applied to the defect of which length is suitable depending on the size of the defect.

So far, an explanation has been given of the piece having a two-layer structure of the copper film 21 and the Sn—Pb solder 22 as shown in FIG. 5(a), as the piece for connecting 15. However, a small piece having a different structure may be employed. In case of employing a metal piece composed of a single structure of only a film of Au, Al or the like, it is effective not only to heat but apply an ultrasonic wave. Or, a piece having a three-layer structure wherein the Sn—Pb solders 22 and 22' are formed on both faces of the copper film 21 by a method of electric plating or the like as shown in FIG. 5(b), has an advantage of dispensing with the differentiation between the top face and the bottom face when it is employed.

Further, FIG. 5(c) shows a three-layer structure wherein the copper layer 21 is adhered to the organic material layer 23 having heat resistance as in a polyimide or the like, and the solder layer 22 of Sn—Pb or the like is formed on the copper layer by a method of electric plating or the like, which has an advantage of dispensing with the coating of polyimides to a very small region. FIG. 5(d) shows a structure wherein the solder layer 24 is formed on both ends of one face of the copper film 21, FIG. 5(e) shows a structure wherein the solder layers 24 and 24' are formed on the both ends of the both faces of the copper film, and FIG. 5(f) shows a structure wherein the copper film 21 is adhered to the organic material layer 23 and the solder layer 24 is formed on the both ends of one face of the copper film 21. The above three examples eliminate unnecessary solder as much as possible.

After the modification of all the defects has been finished, the board is transferred to a successive step and an interlayer insulating film and the next conductive line layer are formed. By repeating this procedure, a circuit board having no defects in the conductive line layers is completed.

Figure 8:
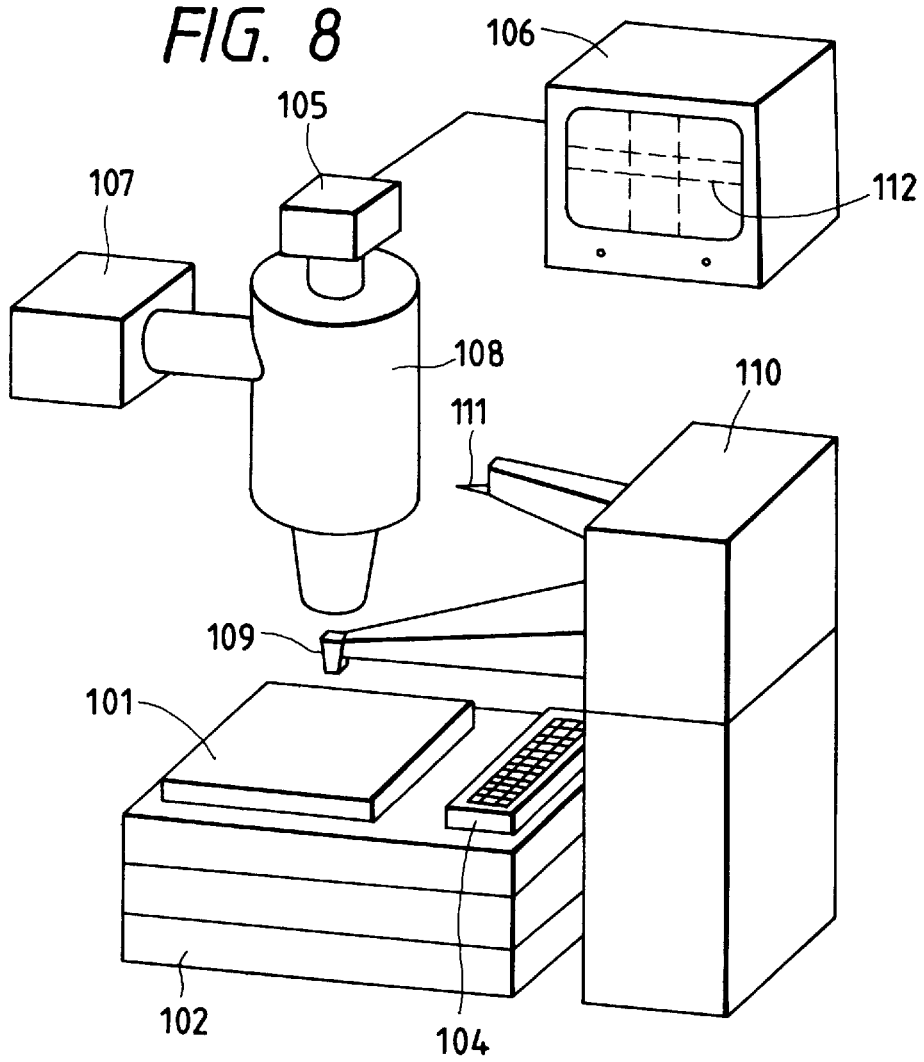
FIG. 8 is a construction diagram showing an embodiment of a conductive line connecting device according to the present invention.

Next, an apparatus suitable for performing the method of connecting conductive lines of this invention is shown in FIG. 8. This apparatus is constructed by a stage 102 for mounting and positioning a circuit board 101 that is an object of connection, a stage control device (not shown) for controlling a long-distance movement of the stage 102 in a certain sequence and a movement based on data from an inspection device, a base 104 which is provided on the stage 102 for arraying and storing pieces for connecting, a TV camera 105 that is employed for observing the surface of the circuit board 101 on the stage and for positioning the piece for connecting, a monitor 106, an optical system 108 having an illuminating light source 107, a connecting tool 109 for adsorbing the piece for connecting and for supplying it to a connecting position, and its drive mechanism 110.

Further, a protection film forming means 111 for forming a protection film is provided to the same drive mechanism 110, which has a structure capable of driving independently from the connecting tool 109. The drive mechanism 110 can position them at an arbitrary position on the board 101 and an escaping position by driving three axes of XYZ or three axes of rθZ.

An explanation will be given of a case of performing a circuit exchange (or repair) shown in the first embodiment as follows. A dummy board is mounted on the stage 102, the connecting tool 109 is pressed on the dummy board, the positional information of the drive mechanism 110 of the connecting tool at that moment is memorized, a trace of the connecting tool 109 after it has been escaped is observed by the optical systems of 108, 105 and 106, and the position of the trace is adjusted such that it comes in the field of vision of the optical system, that is, about the center of the image plane of the monitor 106. The position of the trace is displayed on the monitor 106 by generating electron lines 112. Next, the board 101 which needs to be repaired is mounted and fixed on the stage 102. In the board 101, the organic protection film at the position to be connected is removed by, for instance, an excimer laser, and terminals to be connected are exposed.

The stage 102 is driven, and is approximately moved to a position of the base 104 wherein the pieces for connecting are arrayed and stored, and the electron lines 112 and the piece for connecting are finely positioned while observing them by the optical systems 108 and 105 and the image plane of the monitor 106. Thereafter, the connecting tool 109 is lowered and the connecting piece is adsorbed to the front end of the tool for connecting 109. A vacuum adsorption is suitable to this adsorbing operation when the piece for connecting is comparatively large and an electrostatic adsorption is suitable for the operation when it is very small. However, the operation is not restricted to these methods.

After the connecting tool 109 adsorbing the piece for connecting has been escaped, the portion that needs connection on the board 101 is reproduced on the field of vision of the monitor 106 in accordance with design data by driving the stage 102. Thereafter, the connecting position and the electron lines 112 are positioned while observing them by the monitor 106, and the connecting tool 109 adsorbing to the piece for connecting presses the piece for connecting to a position previously memorized by the drive mechanism 110 of the connecting tool. At this moment, the connecting tool 109 is heated to a temperature of melting the solder and therefore, the piece can be adhered firmly to the connecting terminal. The connecting tool 109 is escaped from the connecting position and the connection is completed. In the connecting operation, the heating temperature can be reduced by applying not only the temperature but an ultrasonic wave to the connecting tool 109, and an excellent connection can be provided even when the surface of the connecting terminal is oxidized.

After all the connecting operation is finished, a protection layer is formed on the connecting portion. This object is achieved by dripping, for instance, a polyimide material on the connecting portion by using the protection layer forming mean (polyimide material droplet supplying mean) 111 and polymerizing it by baking. Further, the electrode 8 for connecting the LSI chip 7 is present in the vicinity of the windowed portion. Therefore, it is necessary to drip the polyimide material locally, only to the windowed portion such that it does not spread to the electrode 8. The method of positioning in this operation is the same as the positioning method of the connecting tool 109 as shown in FIG. 8. That is, the resin is previously dripped on the dummy board, and the position of the drive mechanism 110 and the electron lines 112 on the monitor 106 are made agree to each other. Then, the dripping position can be positioned simply by aligning the electron lines 112. However, this only shows an example and the positioning can be performed by observing simultaneously the front end of the protection layer forming means 111 and the surface of the board 101. This invention naturally include methods capable of performing the positioning without deviating from the gist of the present invention.

Further, the protection layer forming means (polyimide material droplet supplying means) 111 may supply a droplet of a resin material of a polyimide material or the like by the principle of ink jet. In short, it is necessary to locally supply the droplet of a resin material only to the window such that the resin material does not spread to the electrode 8, since the electrode 8 for solder to the LSI chip 7 is present in the vicinity of the windowed portion. A material is selected to the protection layer which stands a temperature under which the LSI chip is mounted on the board 101 shown in FIG. 8 by the CCB bonding, and which can prevent the bridge formation of the solder. Other than the polyimide resin, a resin is selected which is the most pertinent with respect to the baking temperature and the heat resisting temperature among an epoxy resin, a phenolic resin, an ultraviolet curing resin, a silicon resin and the like.

An explanation has been given to the first embodiment wherein the connecting tool 109 and the protection layer forming means 111 are driven by the same drive mechanism 110 as shown in FIG. 8. However, they may be driven by respectively by independent drive mechanisms.

Next, an explanation will be given of a connecting apparatus which is a second embodiment of the present invention.

Figure 9:
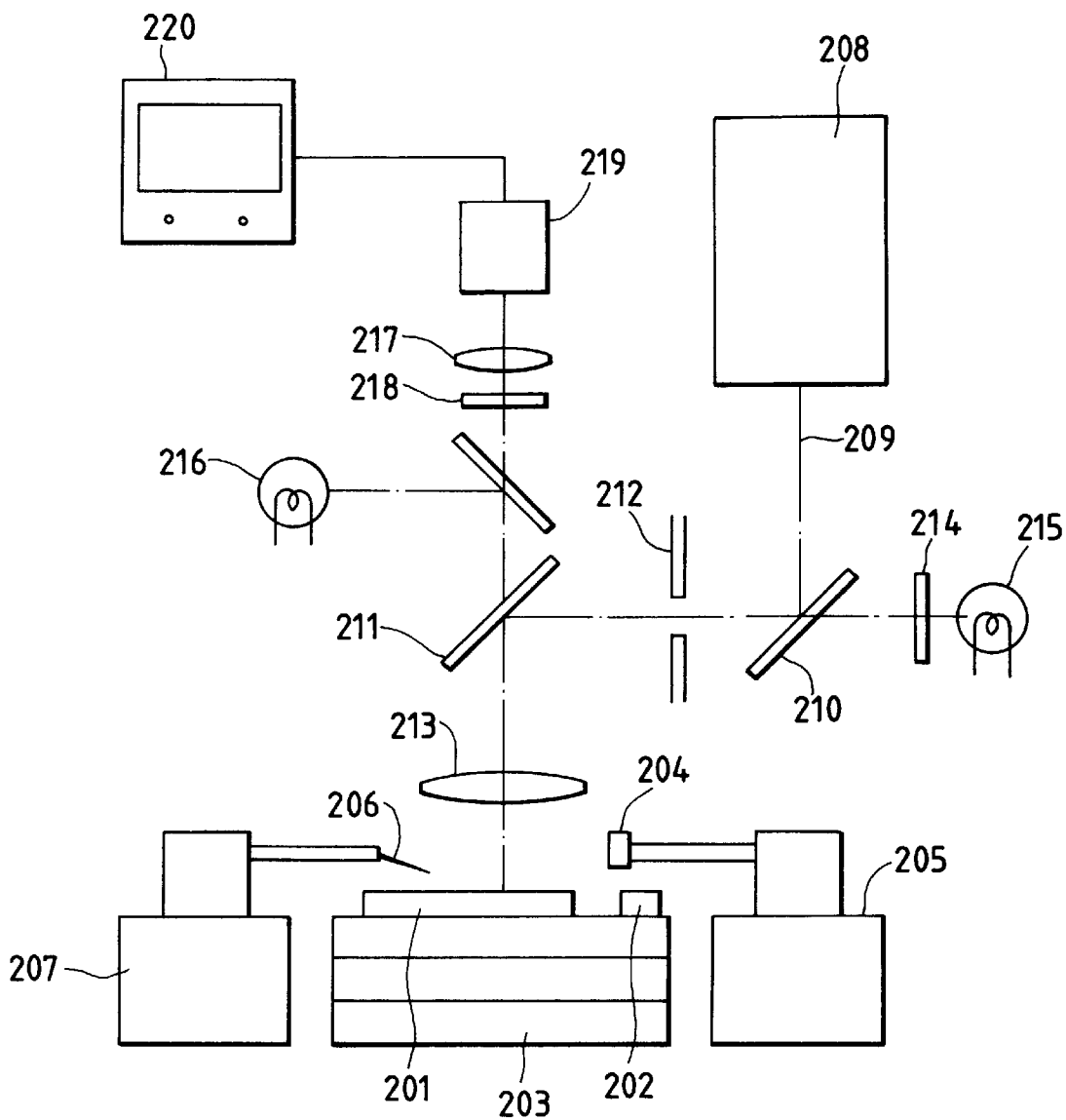
FIG. 9 is a construction diagram showing another embodiment of a conductive line connecting device according to the present invention.

FIG. 9 shows the construction of a connecting apparatus, which is constructed by a stage 203 mounted with a board 201 that needs a connection and a base 202 wherein pieces for connecting are arrayed and stored, a drive mechanism 205 for driving a connecting tool 204, a drive mechanism 207 for driving a protection layer forming means 206, an excimer laser oscillator 208, mirrors 210 and 211 for reflecting a laser beam 209 that has been oscillated by the excimer laser oscillator 208, an aperture 212, an object lens 213 for condensing and observing the laser beam 209, a reference light source 215 having an interference filter 214, an illuminating light source 216 for observation, an image taking lens 217, a laser beam cut filter 218, a TV camera 219 and a monitor 220.

The board 201 is mounted on the stage 203 and an alignment is performed by detecting two specified portions on the board 201. Thereafter, a position that needs connection is reproduced in the field of vision of the TV camera 219 in accordance with the design data. A terminal position to be connected and a projected image of the aperture 212 by the reference light source 215 are positioned while observing the image plane of the monitor 220, the excimer laser oscillator 208 is made oscillated, and the connecting terminal is exposed by forming a window in the polyimide layer by an ablation processing.

The base 202 for storing the pieces for connecting enters the field of vision of the TV camera 219 by driving the stage 203 and the employed piece for connecting and the previously set position of the connecting tool 204 are positioned, and the piece for connecting is adsorbed and fixed by driving the connecting tool 204. Thereafter, the windowed connecting terminal is put into the field of vision of the TV camera 219 by driving again the stage 203 and is positioned to a position wherein the connecting tool 204 is to be disposed. Thereafter, the connecting is completed by pressing the piece for connecting to between the portions of the connecting terminal by driving the connecting tool 204 while heating it.

After all the necessary connection has been completed, portions to be disconnected are put into the field of vision of the TV camera 219 successively in accordance with the design data, the projected image of the aperture 212 by the reference light source 215 and the positions of conductive lines to be disconnected are positioned, windows are made in the polyimide layer by the ablation by the excimer laser beam 209 by making the excimer laser oscillator 208 oscillated, and the conductive lines are disconnected by the same excimer laser beam 209. In this operation, each of the windows is set as a little larger than the region to be disconnected. Further, there is a case wherein a vapor of a metal of the conductive line material adheres to the surrounding of the disconnecting portion in the disconnecting operation and a complete disconnection may not be provided. However, in this case, a very thin metal layer by the adhered vapor can be removed without causing damage to the surroundings by irradiating the excimer laser beam 209 to the surrounding area including the windowed portion at a low power density.

When all the necessary connections and disconnections, that is, the alternations (modification) have been finished, these modified portions are covered with an organic protection layer. The alterated portions (connected and disconnected portions) are successively put into the field of vision of the TV camera 219 by driving the stage 203, the front end of the protection layer forming means 206 is positioned to the alterated portions by the drive mechanism 207 of the protection layer forming means 206, a droplet of, for instance, a polyimide material is emitted in a small amount and is adhered thereto, and the board is baked in a heating furnace thereby finishing the coating of the organic protection layer. The front end of the protection layer forming means 206 may be fixed and the stage 203 may be driven, instead of moving and positioning the position of the protection layer forming means 206. Further, the baking may be performed by a local heating by an infrared-ray lamp or by a laser beam instead of the heating furnace. Further, the coating material may use an epoxy resin, a phenolic resin, an ultraviolet ray curing resin and the like, other than a polyimide resin. In case of employing an ultraviolet ray curing resin, the resin can be cured by the irradiation of an ultraviolet ray and the heating is not necessary.

Next, an explanation will be given of a third embodiment of the present invention.

Figure 10:
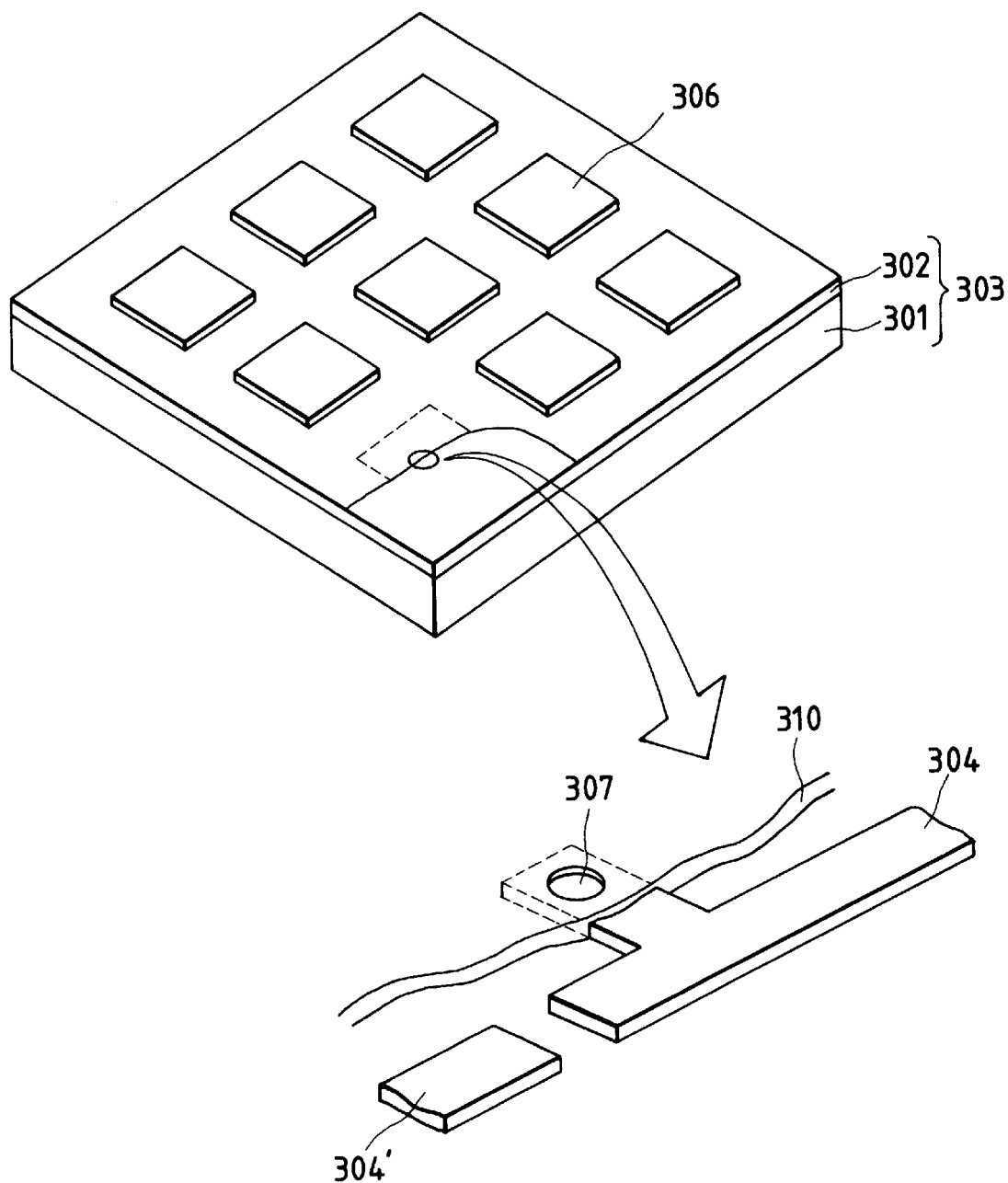
FIG. 10 is a construction diagram of an electronic circuit board which is an object of the present invention.

In a circuit board 303 shown in FIG. 10, multi-layer thin films 302 are formed by insulator layers of polyimide and conductive line layers made of copper or aluminum or the like on a thick film board which is composed of an insulator layer of alumina-ceramics and a plurality of conductive line layers formed by a thick film paste of W or Cu or the like. Conductive lines 304 and 304' for exchanging circuit are formed which are prepared for a circuit exchange. These are previously formed at all the electrodes for connecting 307 or portions wherein the circuit exchange is necessary, in the manufacturing process of the multi-layer thin films 302. Further, the conductive lines 304 and 304' are normally coated with an insulating protection layer 310 of a polyimide or the like for preventing a shortcircuit in the CCB soldering.

Figure 11A:
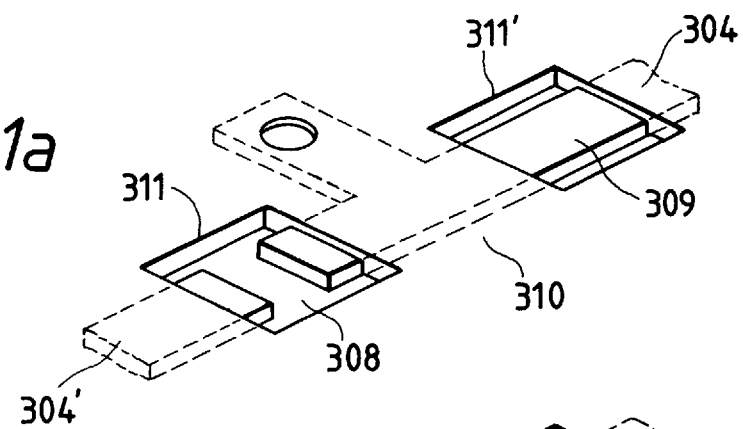
FIGS. 11a, 11b, 11c and 11d are perspective diagrams showing a method of exchanging a circuit on an electronic circuit board.

When a circuit exchange is necessary for some reason (when a failure is discovered in an inspection or when the design exchange is necessary or the like), an LSI chip 360 on the conductive lines 304 and 304' for the circuit exchange is locally heated, the CCB solder is moltened and the LSI chip is removed. (When the conductive lines 304 and 304' for the circuit exchange are not under the LSI chip 306 and when there is no hindrance even if the LSI chip is not removed, the LSI chip may remain as it is.) Thereafter, an excimer laser beam is irradiated and windows 311 and 311' are formed in a polyimide layer 310 which is an insulating protection layer above the conductive lines 304 and 304' for the circuit exchange as shown in FIG. 11a, thereby exposing a conductive line connecting portion 308 and a conductive line disconnecting portion 309.

The windows 311 and 311' are at least wider than the widths of conductive line of the conductive lines 304 and 304' for the circuit exchange, and the depths are such that the conductive lines of the conductive line connecting portion 308 and the conductive line disconnecting portion 309 are completely exposed, as a guidance. Further, in the step of forming the windows 311 and 311' by an excimer laser, the debris adhered to the surrounding of the laser-irradiated portion can be reduced and the quality of the board can be promoted by supplying an assist gas such as helium or oxygen to the irradiated portion in synchronism with the laser irradiation.

Figure 11B:
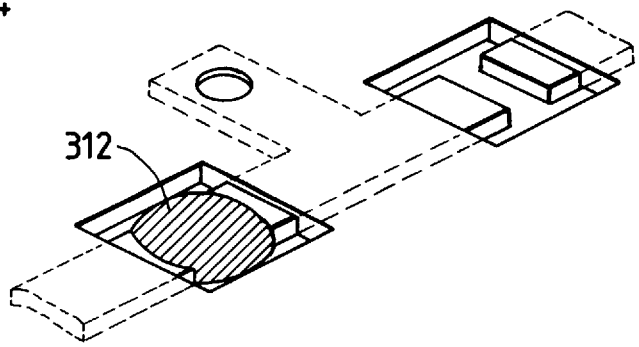
Figure 11C:
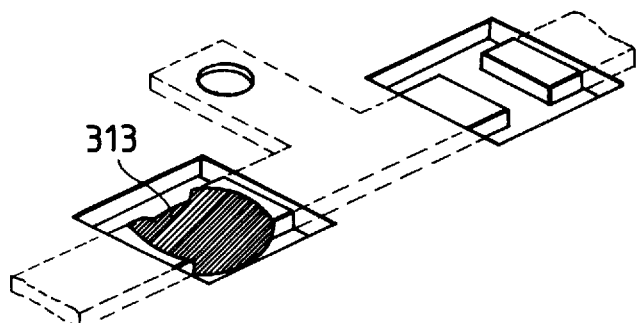

Next, as shown in FIG. 11b, an excimer laser beam having an energy sufficient for shaping the conductive line disconnecting portion 309 in dimensions capable of providing a sufficient electric insulation after disconnecting the conductive lines, and sufficient for melting and removing the conductive lines, is irradiated on the conductive line disconnecting line 309 thereby disconnecting the conductive line. Thereafter, with respect to the conductive line connecting portion 308, a solution 312 mixed with a metallic complex of trifluoroacetic acid palladium ($Pd(CF_3COO)_2$), acetonitrile and N-methylpyrrolidone is supplied thereto by a micro-dispenser. Further, as shown in FIG. 11c, the supplied solution is gradually heated, finally to a temperature of the boiling point of the solvent or more thereby removing only the solvent, a palladium film 313 is precipitated on the conductive line connecting portion 308 by subjecting the complex under a thermal decomposition thereby electrically connecting the connecting portion.

More specifically, the metal complex solution containing 20 weight % of trifluoroacetic acid palladium is coated in a region of φ50 μm on the board, an Ar laser beam having a power density of $1 \times 10^4$ Watt/cm$^2$ is continuously irradiated thereto in a time period of 1 through 10 seconds, thereby enabling to precipitate an excellent palladium metal layer.

In this operation, as the heating means of the supplied material, there are a local heating method by a laser beam, an infrared ray lamp or the like and a method of heating the total board by a heating furnace, a hot plate, a dryer or the like, which heats in a local region which does not negatively influence on the board or the other parts mounted on the board, or in a temperature range which does not adversely influence thereon, thereby precipitating the metal layer. Further, the supplied liquid material may be a liquid material such as an ultra-fine particle dispersion solution wherein a metal paste of copper or the like or ultra-fine particles of a metal of gold or the like is or are dispersed in a solvent such as α-terpineol. That is, in case of employing any liquid material, it is necessary that the liquid material is cured, the heating temperature for precipitating the metal layer is not higher than the melting point of the CCB solder, and the heat resistant temperature of the precipitate metal layer is not lower than the temperature under which the LSI chip is remounted.

In this way, it is possible to connect the connecting portion without causing a mechanical damage, in comparison with a general connecting method of wire bonding, by performing the connection by supplying the liquid material, and the quality of the connecting portion is promoted. Further, since the material is supplied in the liquid state, the material and the conductive line portion can firmly be connected even if a debris after the removal of the polyimide protection layer 310 is present at a portion of the conductive line to be connected, thereby providing high reliability of connection.

In this way, the operation of switching the conventional electric circuit to a new electric circuit is finished.

Figure 11D:
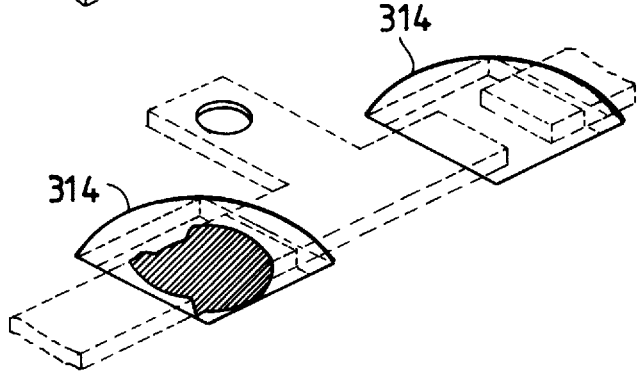

Further, after the circuit exchange has been finished and the LSI chip is to be remounted, in order to prevent the generation of an electric shortcircuit between the conductive line connecting portion 308 and the conductive line disconnecting portion 309, and a solder ball (not shown), an organic insulating material such as a UV curing resin is supplied onto the surfaces of the conductive line connecting portion 308 and the conductive line disconnecting portion 309 which are exposed inside of the windows 311 and 311' by a micro-dispenser thereby coating the exposed metal faces, an UV beam is irradiated on the organic insulating material such as the supplied UV curing resin thereby performing the curing, and coating layers 314 are formed on the conductive line connecting portion 308 and conductive line disconnecting portion 309, as shown in FIG. 11d.

In this operation, the material of the coated layer 314 may be an organic insulating material of an epoxy resin, a polyimide resin or the like. However, when using these materials, it is necessary to evaporate the solvent of the supplied material and to perform the curing by a heating means. As the heating means, a local heating method by a laser beam, an infrared-ray lamp or the like and a method of heating the total board by a heating furnace, a hot plate, a dryer or the like, can be employed, whereby the heating is performed in a local area which does not negatively influence on the board or the other parts mounted on the boards, or in a temperature range which does not adversely influences thereon.

That is, in case of employing any material, it is necessary that the heating temperature for curing the material is not higher than the melting point of the CCB solder and the heat resistant temperature of the cured material is not lower than the temperature under which the LSI chip is remounted.

Further, as the coating material at the conductive line connecting portion 308 and the conductive line disconnecting portion 309 which are provided with a rugged shape, an UV curing resin wherein the volume shrinkage rate before and after the curing is negligibly small, is advantageous. However, if the shape can allow the deformation after the curing, a material of an epoxy resin, a polyimide resin or the like can be employed.

Figure 12A:
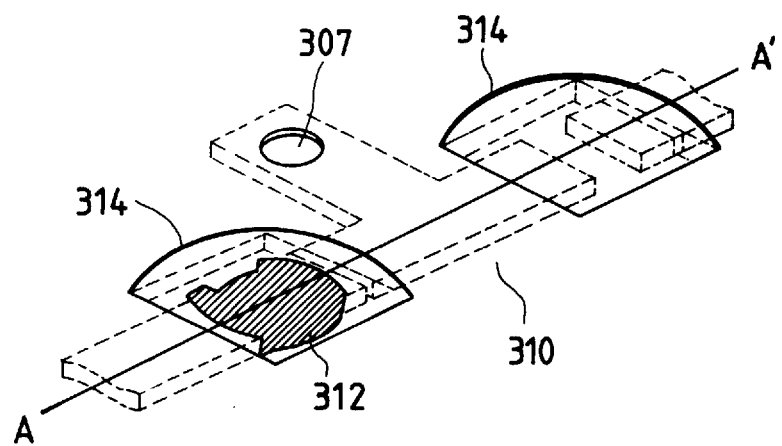
FIG. 12(a) shows a perspective diagram and FIG. 12(b) a sectional diagram taken along line A–A' of FIG. 12(a) of a conductive line connecting portion and a conductive line disconnecting portion after a circuit exchange.
Figure 12B:
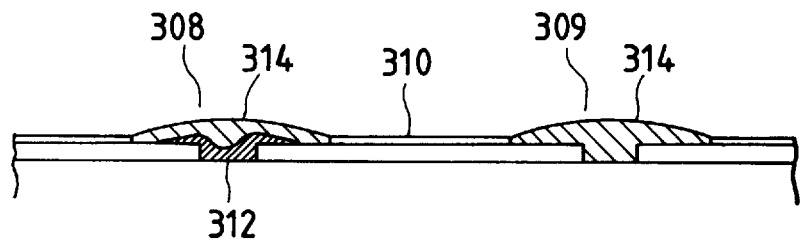

FIG. 12(a) shows a perspective view and FIG. 12(b) a sectional diagram of the conductive line connecting portion 308 and the conductive line disconnecting portion 309 wherein the circuit exchange has been finished. FIG. 12(b) is taken along the line A–A' of FIG. 12(a), and an explanation will be given of the coating performance of the circuit exchange portions by an UV curing resin.

The necessary conditions of coating by an UV curing resin are that the surfaces of the conductive line connecting portion 308 and the conductive line disconnecting portion 309 which are exposed inside of the windows 311 and 311' are completely coated, and that the supplied UV curing resin does not spread out of the windows 311 and 311'. With respect thereto, the connecting method of the conductive line connecting portion 308 greatly influences thereon, since in the coating, a relationship between the surface tension of the UV curing resin and the wettability of the resin to the polyimide protection layer 310, is utilized.

That is to say, when an amount of the connecting material 312 protruding out of the surface of the polyimide protection layer 310 is large, it is difficult to completely coat the metal surface even if the coating is performed. Accordingly, it is necessary to perform the connection at the conductive line connection portion 308 while restraining the protruding the connecting material from the surface of the polyimide protection layer 310 as much as possible. In this respect, this invented method is very advantageous in comparison with the general connecting method of the wire bonding, since the liquid material of a metal complex or the like is utilized.

In case of the wire bonding, there is a problem wherein the wire considerably protrudes out of the surface of the polyimide protection layer 310 after the connection. In the invented method, the connecting material does not protrude out of the surface of the polyimide protection layer 310 or the protrusion from the surface of the polyimide protection layer 310 can be restrained to a considerable degree, thereby enabling to promote the coating performance. Therefore, the supplied UV curing resin does not spread out of the window above the conductive line connecting portion 308, and adherence of the resin to an unnecessary portion such as a portion above the electrode 308 for connecting can be prevented. In short, the purpose of coating is achieved by supplying an organic insulating material which can stand the heating temperature in remounting the LSI chip, to the conductive line connecting portion 308 and the conductive line disconnecting portion 309 and curing it to thereby coat the surface of metal.

Thereafter, the LSI chip is remounted on the MCM board and the circuit exchange is finished. By this formation of the coating layer, the electrical shortcircuit between the circuit exchange portion and the solder ball can be prevented thereby enabling to promote the reliability of the MCM board.

An explanation has been given to the case wherein an excimer laser is employed as the laser which is employed in the removal of the polyimide layer or the disconnecting of the conductive lines. However, this invention is not restricted thereto. Other than the representative excimer laser beams having the wavelengths of 308 nm, 248 nm and 193 nm, a laser which can oscillate a wavelength having an energy that can disconnect the bonding of an organic material layer of a polyimide or the like, as in the third- or the fourth-harmonic generate of a YAG laser, the second-harmonic generate of a ruby laser, or the like. Further, the disconnection may be performed by scanning and irradiating a focused ion beam irradiated from a high brightness ion source such as a liquid metal ion source. In short, the necessary removing processing may be performed without causing damage in the surrounding by selecting the ranges of wavelength and energy density.

Further, the most desirable method of irradiating laser is a system wherein a rectangular aperture provided on a laser beam path is projected. However, the irradiation may be performed by converging a laser beam to a circular spot, or a necessary area may be removed by scanning a very fine spot.

In this example, an explanation has been given to only the case wherein the connecting electrode 307 and the conductive lines 304 and 304' for exchanging circuit are present in the same layer, and the electrode and the conductive lines are made of the same material. However, it is possible that the electrode 307 for connecting, the conductive line connecting portion 308 and the conductive line disconnecting portion 309 are in respective different layers and the respective materials of these are different.

Next, an explanation will be given of a fourth embodiment of the present invention.

As shown in FIGS. 13a-(1) and 13a-(2), in the manufacturing process of multi-layer thin films 302 of an MCM board 303 explained above, there are a defect (open pattern defect) wherein a portion of a metal layer which is a conductive line 321 (the material is a metal of Cu, Al, Ni, W, Mo or the like, or a composite layer of these) is deficient, and the defect (short pattern defect) wherein an extra metal layer, not shown, is present, on a polyimide layer 322 which is an inter-layer insulating film. FIGS. 13a-(1) through 13c-(2) simultaneously and correspondingly show the plane views and the sectional diagrams of the defect portion.

Normally, a plurality of conductive line layers are formed in the multi-layer thin film. Therefore, when they are completed while including these defects, the circuit board 303 per se becomes a failure, or unreliable even if it is not a failure. Accordingly, it is necessary to modify the defects with respect to each layer of the conductive line layers.

Among these, with respect to the short pattern defect of the metal layer (not shown), it is possible to remove and modify the defect by irradiating, for instance, an excimer laser. In this case, the laser is not restricted to an excimer laser, and is selected from a pulse laser having a wavelength from a near infrared ray to an ultraviolet ray, in view of processing the metal thin film. The representative ones are a fundamental wave of a YAG laser and its harmonic generate, a glass laser, a ruby laser, a XeCl laser, a KrF laser, an ArF laser and the like.

On the other hand, the open pattern defect is modified in the following procedure.

Firstly, as shown in FIGS. 13b-(1) and 13b-(2), a solution 323 wherein a metal complex such as trifluoroacetic acid palladium ($Pd(CF_3COO)_2$), acetonitrile and N-methylpyrrolidone are mixed, to the open pattern defect by a micro-dispenser. The supplied liquid material is heated and a palladium metal layer 324 is precipitated at the open pattern defect thereby electrically connecting the deficiency portion, as shown in FIGS. 13c-(1) and 13c-(2).

As the heating means of the liquid material, there are a local heating method by a laser beam, an infrared ray lamp or the like and a method of heating the total board by a heating furnace, a hot plate, a dryer or the like, whereby the metal layer 324 is precipitated by heating it in a local area that does not negatively influenced on the board and, or a temperature range which does not adversely influence on the board. Further, the supplied liquid material may be a liquid material of an ultra-fine particle dispersion solution or the like wherein a metal paste of copper or the like or ultra-fine particles of a metal such as gold is or are dispersed in a solvent such as α-terpineol.

In the case of employing any liquid material, it is necessary that the heating temperature for precipitating the metal layer 324 is not larger than the heat resistant temperature of the polyimide layer 322 and that the heat resistant temperature of the precipitated metal layer 324 is not higher than the operational temperature in later steps. The open pattern defect of the conductive line 321 can be modified by the above means. Further, the connection can be performed on the connected portion by connecting with the liquid material without applying a mechanical damage, in comparison with the general connecting method of wire bonding, thereby enabling to promote the quality of connection. Further, since the irregularity at the modified portion is minimized, the invention has an effect wherein the multi-layer formation of the conductive layers can easily be performed in later manufacturing steps.

Next, an explanation will be given of another embodiment of a method of modifying an open pattern defect of a conductive line in the multi-layer thin films 302 of the circuit board 303 in reference to FIGS. 14a-(1) through 14d-(2). First, a liquid material of a metal complex solution 333 is supplied, as shown in FIG. 14b-(1), to a defect portion of a thin film conductive line 331 having an open pattern defect, which is formed on a polyimide thin film 332 that is an inter-layer insulating film, as shown in FIGS. 14a-(1) and 14a-(2) by using a micro-dispenser. FIGS. 14a-(1) through 14d-(2) simultaneously and correspondingly show the plane views and the sectional diagrams of the defect portion. The liquid material is heated and a metal layer 334 is precipitated at the open pattern defect as shown in FIGS. 14c-(1) and 14c-(2), thereby electrically connecting the deficiency portion.

Thereafter, portions 335 and 335' in the precipitated metal layer 334 which spread out of the conductive line width of the thin film conductive film 331, are irradiated with an excimer laser, that is shaped by a rectangular aperture slit or the like, whereby the portions of the metal layer 334 are removed. In this removing operation, also the polyimide thin film 332 is simultaneously processed by irradiating a portion of the excimer laser beam on the polyimide thin film 332. It is necessary to determine the irradiation energy and the number of irradiation of the excimer laser beam such that the depth of processing is sufficiently smaller than the film thickness of the polyimide thin film 332. In this way, the metal film 334 at the open pattern defect is shaped as in FIGS. 14d-(1) and 14d-(2), thereby electrically connecting and modifying the deficiency.

The modification can be carried out even in the case wherein the open pattern defect of the thin film conductive line 331 is large. Further, as for the employed laser beam, an explanation has been given to the case wherein an excimer laser is employed. However, this invention is not restricted to this example. Other than the representative excimer laser beams having the wavelengths of 308 nm, 248 nm and 193 nm, a laser can be employed which can oscillate a wavelength having an energy that can disconnect the bonding of an organic material layer of a polyimide or the like, such as the third- or the fourth-harmonic generate of a YAG laser, the second-harmonic generate of a ruby laser and the like.

Further, a liquid material of a metal complex solution 343 is supplied, as shown in FIGS. 15b-(1) and 15b-(2), to a deficiency defect portion of a thin film conductive line 341 having an open pattern defect, which is formed on a polyimide thin film 342 that is an inter-layer insulating film, as shown in FIGS. 15a-(1) and 15a-(2), by employing a micro-dispenser. FIGS. 15a-(1) through 15d-(2) show simultaneously and correspondingly the plane views and sectional diagrams of the deficiency defect portion. Further, only a conductive line deficiency portion 344 of the supplied metal complex solution 343 is heated by a local heating mean of a laser beam, an infrared ray lamp or the like, thereby precipitating a metal film 345 as shown in FIGS. 15c-(1) and 15c-(2).

Thereafter, extra portions 346 and 346' of the supplied metal complex solution 343 are removed by a removing means such as an ultrasonic cleaning or the like, and the metal layer is shaped as shown in FIGS. 15d-(1) and 15d-(2), thereby electrically connecting and modifying the deficiency portion. By the above procedure, even when the deficiency portion of the thin film conductive line 341 is large, it is possible to precipitate and modify the metal layer 346 only at the necessary portion without causing any damage to the polyimide protection layer 342.

Further, a groove 353 is formed on a polyimide thin film 352 by irradiating an excimer laser beam under an energy condition capable of processing only the polyimide thin film 352 which is a matrix layer of a thin film conductive line 351, without causing damage to the thin film conductive line 351, as shown in FIGS. 16b-(1) and 16b-(2), to a deficiency portion of the thin film conductive line 351 that is formed on the polyimide thin film 352 that is an inter-layer insulating film, as shown in FIGS. 16a-(1) and 16a-(2). FIGS. 16a-(1) through 16d-(2) simultaneously and correspondingly show the plane views and the sectional diagrams of the deficiency portion. The depth of the groove 353 formed by an excimer laser beam should be smaller than the film thickness of the polyimide thin film 352 which is the matrix layer of the thin film conductive line 351. Further, as shown in FIGS. 16c-(1) and 16c-(2), a liquid material of a metal complex solution 354 or the like is supplied to the inside of the formed groove 353 by a micro-dispenser.

Thereafter, as shown in FIGS. 16d-(1) and 16d-(2), a metal film 355 is precipitated at the inside of the groove 353 by heating the supplied liquid material thereby electrically connecting and modifying the conductive line deficiency portion. The shape of the formed groove is not restricted to the one wherein the conductive line deficiency portion is linearly connected. It is possible to form the groove on the polyimide thin film 352 between arbitrary connecting portions on the same conductive line layer, by an arbitrary route, and to supply a liquid material to the inside of the groove. By the above means, it is possible to modify not only a conductive line deficiency portion having a specified shape but all the open pattern defects that can be caused.

Further, an explanation will be given of another embodiment of this invention as follows. In the manufacturing steps of the multi-layer thin films on the circuit board 303, other than the short pattern defects and the open circuit defects of the conductive lines explained as above, similar defects are caused with respect to the polyimide thin film which is an inter-layer insulating film. An embodiment of the method of modification will be explained in reference to FIGS. 17a, 17b and 17c. FIG. 10 shows the sectional diagram of the circuit board 303 in the manufacturing process.

Figure 17A:
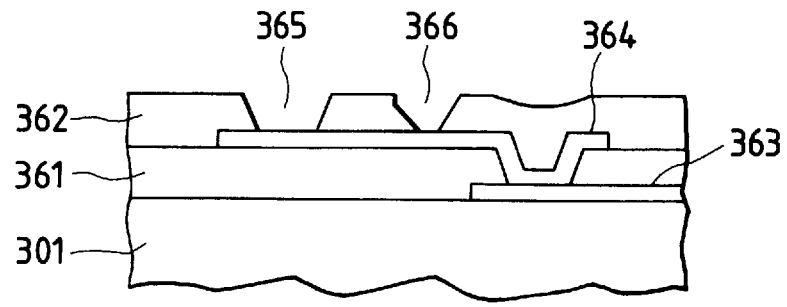
FIGS. 17a, 17b and 17c are sectional diagrams showing a method of modifying an open pattern defect of an insulator layer on an electronic circuit board.

In FIG. 17a, a first conductive line layer 363 and a second conductive line layer 364 (the material is a metal of Cu, Au, Ni, W, Mo or the like, or a composite layer of these) are formed on a thick film substrate 301 interposing a polyimide thin film 361 that is a first insulator layer, and a second insulator layer 362 is formed on the second conductive line layer 364. In the second insulator layer 362, a through hole 365 is provided which contacts a third conductive line layer which is to be formed in later steps. When a deficiency portion 366 of the second insulator layer 362 is generated by some cause and a portion of the second conductive line layer is exposed at the bottom face of the deficiency portion, the exposed portion is a cause for forming an unnecessary shortcircuit portion between the conductive line layer 362 and the later formed third conductive line layer. Further, an extra defect (for instance, non-penetration of the through hole 365) of the polyimide thin film, not shown, will cause a disconnection failure between the conductive line layers or the like. Therefore, these defects should be modified with respect to each layer.

In this operation, an excimer laser beam can naturally be used as a laser for modifying the extra defect of the insulator layer, that is, for removing the polyimide film. However, this invention is not restricted to this example. Other than the representative excimer laser beams having the wavelengths of 308 nm, 248 nm and 193 nm, a laser which can oscillate a wavelength having an energy capable of disconnecting the bonding of an organic material film of a polyimide or the like, such as the third- or the fourth-harmonic generate of a YAG laser, the second-harmonic generate of a ruby laser or the like. Further, it is possible to perform the disconnection by scanning and irradiating a focused ion beam irradiated from a high brightness ion source such as a liquid metal ion source. In short, it is possible to perform the necessary removing processing without causing damage to the surrounding, by selecting pertinent ranges of the wavelength and the energy density.

Figure 17B:
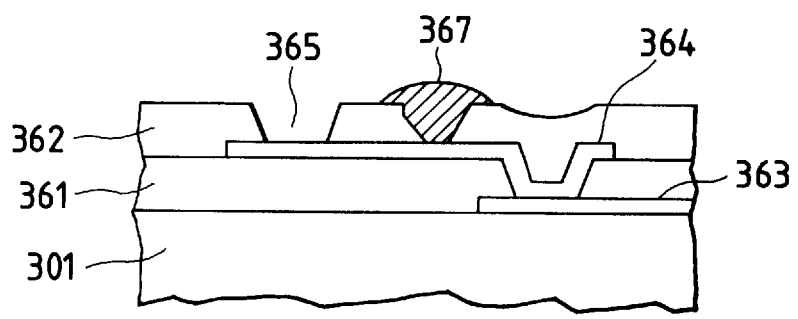
Figure 17C:
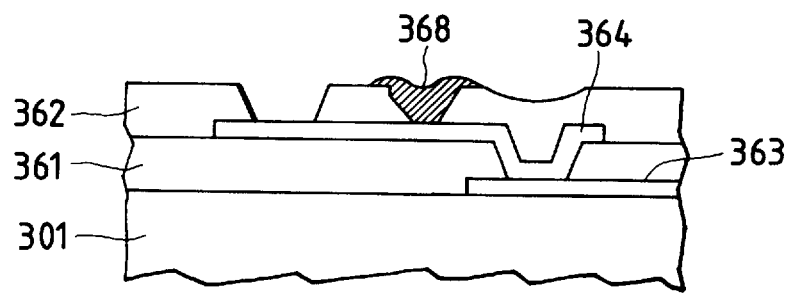

On the other hand, the deficiency defect is modified by the following steps. First, an organic insulator material of a polyimide resin 367 or the like is applied to a deficiency portion of the polyimide layer by a micro-dispenser, as shown in FIG. 17b. The supplied material may be an epoxy resin, or an organic insulating material of a UV curing resin or the like. After these liquid materials have been supplied, only the solvent supplied material is evaporated by a heating mean and the material is cured (in case of using an UV curing resin, the heating is not necessary and the curing is performed by irradiating only an ultraviolet ray) as shown in FIG. 17c. As the heating means, there are a local heating method by a laser beam, an infrared ray lamp or the like and a method of heating the total board by a heating furnace, a hot plate, a dryer or the like, and the heating is performed in a range which does not adversely influence on the board. That is, in case of employing any material, it is necessary that the heating temperature for curing the material is not higher than the heat resistant temperature of the polyimide films 361 and 362 and that the heat resistant temperature of the cured material is not lower than the operational temperature in later manufacturing steps.

By the above means, the open pattern defect of the polyimide thin film can be modified.

Next, an explanation will be given of another embodiment of a method for modifying a deficiency defect of a polyimide thin film.

Figure 18A:
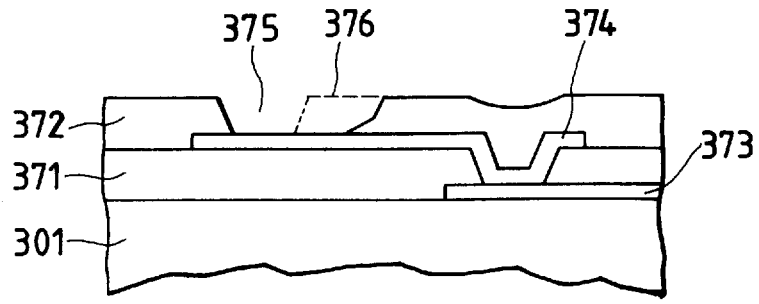
FIGS. 18a, 18b, 18c and 18d are sectional diagrams showing a second embodiment of a method of modifying an open pattern defect of an insulator layer.
Figure 18B:
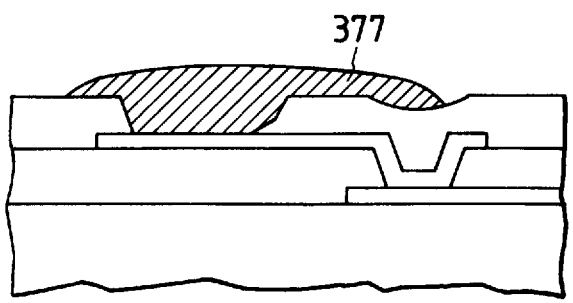
Figure 18C:
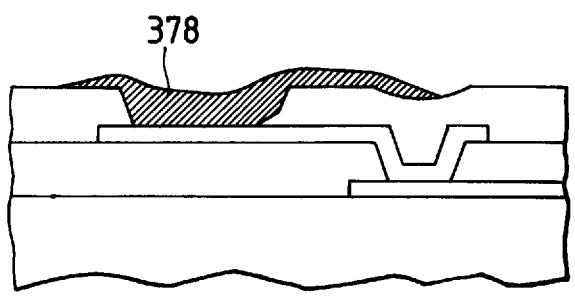

In FIG. 18a, a first conductive line layer 373 and a second conductive line layer 374 are formed on a thick film substrate 301 interposing a polyimide thin film 371 which is a first insulator layer, and a second insulator layer 372 is formed on the second conductive line layer 374. A through hole 375 is provided in the second insulator layer 372 for contacting a third conductive line layer that is to be formed in later steps. When a pattern deficiency defect 376 including the pattern of the through hole 375 is generated by some cause, an organic insulating material of a polyimide resin 377 or the like is supplied to the through hole 375 and the pattern deficiency portion 376 by a micro-dispenser as shown in FIG. 18b, and the supplied material is cured by a heating means as shown in FIG. 18c.

Figure 18D:
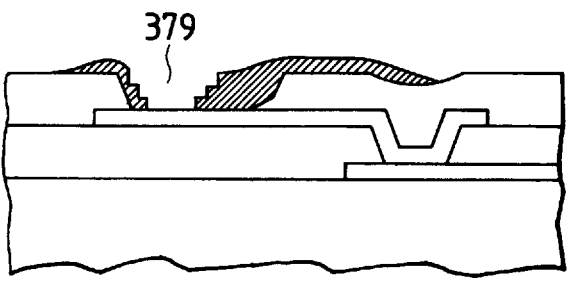

Thereafter, only a portion 378 that is to be a through hole on the polyimide film, is removed by irradiating an excimer laser, thereby forming a through hole 379 as shown in FIG. 18d. In forming the through hole 379, it is possible to provide a tapering in the through hole 379 by continuously changing a laser beam irradiation area (widening or narrowing the irradiation area) during the starting and finishing of the laser irradiation. By using this means, it is possible to prevent a step disconnection at the through hole portion under the later formed third conductive line layer. By the above process, a partial exposure using a mask is not necessary, and with respect to a negative type material and a positive type material, all the deficiency defects that can be generated in the polyimide insulator layers 371 and 372 can easily be modified by the similar means.

In the manufacturing steps of the multi-layer thin films 302 of the circuit board 303, a circuit board having no defect in the multi-layer thin films 302 can be provided by employing the conductive line modifying means and the insulator layer modifying means of this invention mentioned above.

Figure 19:
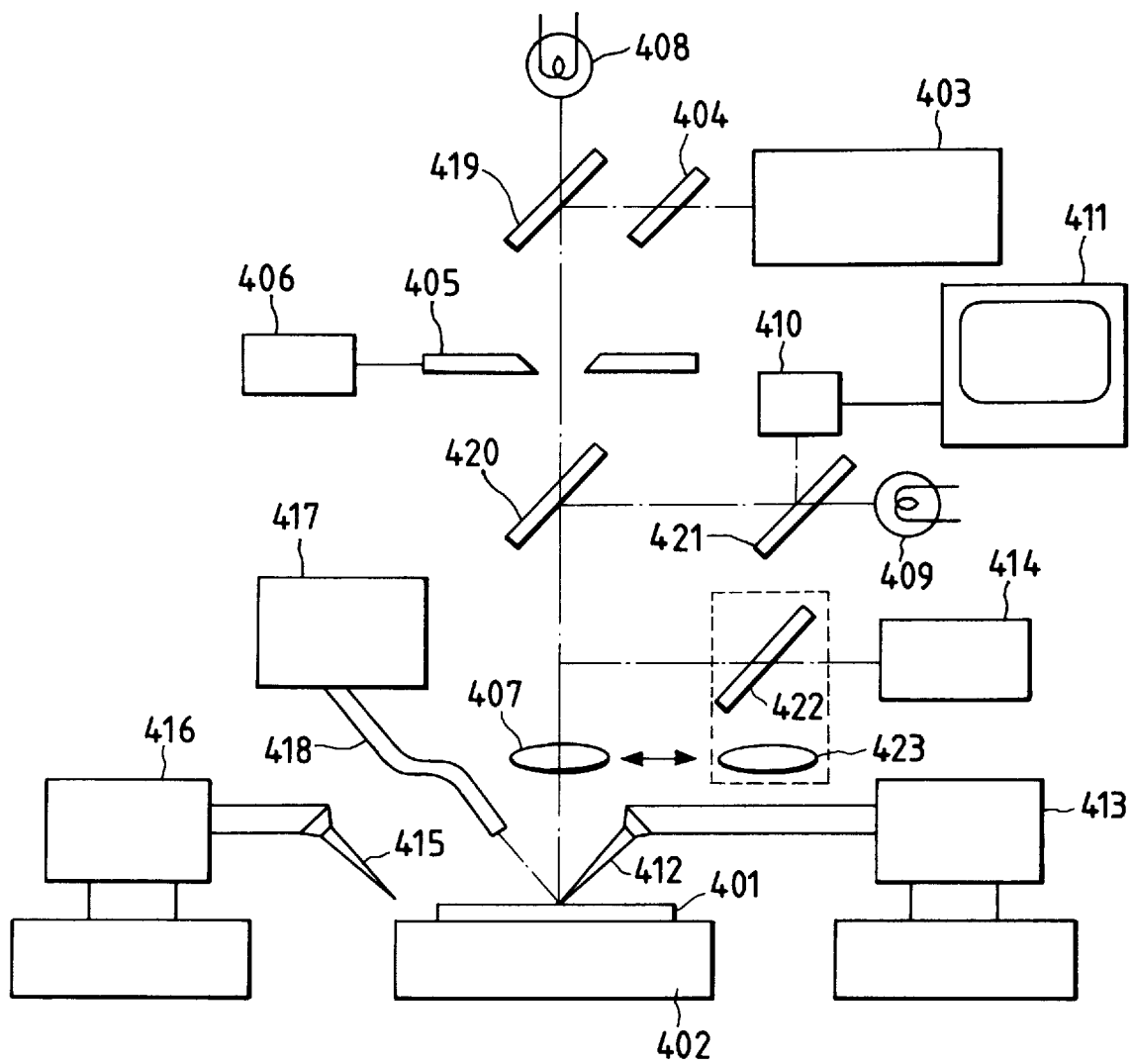
FIG. 19 is a construction diagram of an apparatus for performing a method of exchanging a circuit according to the present invention.

Next, FIG. 19 shows an example of an apparatus for modifying an electronic circuit board according to the present invention.

This apparatus is constructed by a stage 402 for mounting and positioning a circuit board 401, an XeCl excimer laser oscillator 403 (laser oscillating wavelength 308 nm) for removing an insulating protection film on conductive lines for circuit exchange and for disconnecting exposed conductive lines on the circuit board 401, an attenuation filter 404 of laser beam, a square aperture slit 405 for shaping a laser beam from the excimer laser oscillator 403 in an arbitrary shape, a slit moving means 406 for controlling aperture dimensions of the square aperture slit 405, an object lens 407 for condensing and projecting the laser beam shaped by the square aperture slit 405 onto an MCM board 401 by a certain reduction rate, a reference light source 408 for making a reference to an area on the circuit board 401 for irradiating the laser beam, an illumination light source 409 for observing the surface of the circuit board 401, a TV camera 410, a monitor 411, a micro-dispenser 412 for supplying a palladium complex for connecting conductive lines on the circuit board 401, an infrared ray lamp 414 for heating the supplied palladium complex, a micro-dispenser 415 for supplying a UV curing resin to windows of a conductive line disconnecting portion and a conductive line connecting portion on the circuit board 401, an ultraviolet ray lamp 417 for curing the supplied UV curing resin, a fiber 418 for transmitting an ultraviolet ray and irradiating the ultraviolet ray onto the circuit board 401, half mirrors 419 through 422 and an object lens 423 for condensing an infrared ray from the infrared ray lamp 414.

Further, the front end portions of the micro-dispensers 412 and 415 can be moved to a central position in an observation image plane of the monitor 411 and escaping positions from above the stage 402 by respective moving mechanisms 413 and 416. Further, the half mirror 422 and the object lens 423 can be exchanged by another half mirror and the object lens 407 in irradiating an infrared ray onto the circuit board 401.

An explanation will be given of a case for performing a circuit exchange which is a third embodiment.

First, the micro-dispensers 412 and 415 are made escape from above the stage 402, and the circuit board 401 that is an object of the circuit exchange is mounted on and fixed to the stage 402. Further, the stage 402 is approximately moved based on an inspection information by a stage controller, not shown, such that an electrode that is connected to the conductive lines that needs the circuit exchange on the circuit board 401, is disposed at a coordinate shown in the monitor 411. Thereafter, the stage 402 is finely moved and the position of the stage 402 is finely adjusted such that a conductive line disconnecting portion disposed proximate to the electrode agrees with a laser irradiating portion on the monitor 411, and aperture dimensions of the square aperture slit 405 are set by the slit moving means 406. Thereafter, a laser beam is oscillated from the excimer laser oscillator 403, the laser beam that has been shaped by the square aperture slit is condensed on and irradiated to the polyimide protection layer above the conductive line by the object lens 407. In this case, the attenuation filter 404 is set to have a pertinent value previously, since the energy density of the irradiated laser beam is desirable to be approximately 0.1 through 10.0 J/cm$^2$. Further, the number of pulse of irradiation is set in consideration of a relationship between the film thickness of the polyimide protection layer to be removed and the amount of removal by one pulse of the laser irradiation.

Further, if necessary, an assist gas such as helium or oxygen is supplied to the laser-irradiated portion by a nozzle, not shown, or the like at a flow rate of approximately several l/minute, thereby enabling to reduce a debris adhered to the surrounding of the laser-irradiated portion.

In this way, a window is formed on the conductive line above the conductive line disconnecting portion on the circuit board 401 without causing damage to the conductive line, and the disconnecting portion is completely exposed. Thereafter, the aperture dimensions of the square aperture slit 405 is set smaller than the dimensions of the window by the slit moving means 406. For instance, in disconnecting a copper line having a film thickness of 2 μm, the attenuation filter 404 is changed such that the energy density at the laser-irradiated portion is approximately 10 J/cm$^2$, the excimer laser is irradiated onto the exposed conductive line disconnecting portion, and the conductive line is disconnected. Further, there is a case wherein a complete disconnection can not be provided wherein a vapor of a metal material of the conductive line adheres to the surrounding of the disconnecting portion after the disconnection of the conductive line. In this case, a very thin metal film by the adhered vapor can be removed without causing damage to the surrounding by irradiating an excimer laser beam having a low energy density to the peripheral area including the window.

Next, the position of the stage 402 is finely adjusted such that a conductive line connecting portion coupled with the conductive line disconnected by the above procedure, agrees with the laser-irradiated portion on the monitor 411, and the aperture dimensions of the square aperture slit 405 are set by the slit moving means 402. Thereafter, a window is formed in the polyimide protection layer above the conductive line connecting portion as in the conductive line disconnecting portion.

Thereafter, the micro-dispenser 412 is moved by the moving mechanism 413 such that the front end portion of the micro-dispenser 412 is disposed on the window formed at the conductive line connecting portion, and a trifluoroacetic acid palladium solution, for instance, is supplied to the inside of the window of the exposed conductive line connecting portion while observing it by the monitor 411. Further, after the micro-dispenser 412 has been made escape from above the stage 402, the object lens 407 and the half mirror 422 for irradiating the excimer laser beam are exchanged with the object lens 423 and the half mirror 422 for irradiating an infrared ray, the infrared ray lamp 414 is switched on, and only the trifluoroacetic acid palladium solution supplied onto the conductive line connecting portion is locally heated. In this way, a palladium metal film is precipitated on the conductive line connecting portion thereby electrically connecting the conductive line connecting portion. When the heating by the infrared ray lamp 414 has been finished, the half mirror 422 and the object lens 423 for irradiating the infrared ray are again exchanged with the half mirror 422 and the object lens 407 for irradiating the excimer laser beam.

After repeating the above procedure and after finishing all the necessary circuit exchange, a coating film is formed on the conductive line disconnecting and connecting portions. First, the micro-dispenser 415 is moved by the moving mechanism 416, and a UV curing resin, for instance, is supplied to the window wherein the connection of conductive line has been finished, while observing the monitor 411. Further, the stage 402 is finely moved and the UV curing resin is similarly supplied to the inside of the window of the conductive line disconnecting portion. After supplying the UV curing resin to all the portions of circuit exchange, the micro-dispenser 415 is made escape from the stage 402, the ultraviolet ray lamp 417 is switched on, an ultraviolet ray is irradiated through the fiber 418, and the respectively supplied UV curing resin is cured thereby forming the coating layers on the conductive line disconnecting and connecting portions.

Thereafter, the LSI chip is remounted on the circuit board.

An explanation has been given as an example of a trifluoroacetic acid palladium solution as a material for supplying to the conductive line connecting portion. However, an ultra-fine particle dispersion solution wherein a metal paste of copper or the like, or ultra-fine particles of a metal such as gold is or are dispersed in a solvent, may be employed. Further, as a heating means after they have been supplied, other than the infrared ray lamp, a laser beam, a bake furnace, a dryer, a hot plate or the like can be employed. As a material of the coating film formed on the conductive line disconnecting and connecting portions, the material is not restricted to a UV curing resin and an epoxy resin, a polyimide resin and the like may be employed. When they are employed, the ultraviolet ray lamp is not necessary and the material can be cured by a heating mean such as an infrared ray lamp.

According to the present invention, an effect is achieved wherein it is possible to disconnect or connect a portion of conductive lines for partially changing the conductive lines in an electronic circuit board, or for modifying defects caused in the manufacturing process. In the former case, a new circuit board can be completed in an extremely short time period without remaking it. In the latter case, the manufacturing yield of the electronic circuit board can considerably be promoted.

According to the present invention, an effect is achieved wherein a logic modification can be performed without enlarging the electronic circuit board, by providing conductive lines for repair in approximately the region of an LSI chip, and without adversely influencing on the connecting portions by solder or the like.

According to the present invention, a connection can be performed without causing mechanical damage to the connecting portion by connecting conductive line connecting portions in a circuit exchange portion on an electronic circuit board, or defect portions of a conductive line pattern by using a liquid material of a metal complex solution or the like, thereby promoting the quality of the connecting portion.

The invention provides an effect of preventing generation of an electric shortcircuit between a circuit exchange portion and a solder ball, by providing a protection coating by an organic insulating material on conductive line connecting and disconnecting portions at a circuit exchange portion on the electronic circuit board.

The invention provides an effect of considerably restraining protrusions of a connecting material from the surface of a polyimide protection layer, by connecting a conductive line connecting portion at a circuit exchange portion on the electronic circuit board by using a liquid material of a metal complex solution or the like. Thereby, an effect is achieved which can prevent the coating material from spreading out of a window on the conductive line connecting portion and adhering to an unnecessary portion. Further, an effect is achieved wherein a multi-layer formation of conductive line layer can easily be achieved in later manufacturing steps since the protrusion of the connecting material is considerably restrained in modifying an open pattern defect.

The invention provides an effect wherein it is not necessary to perform a partial exposure employing masks, by supplying an organic insulating material to a pattern deficiency portion on an insulator layer on the electronic circuit board and curing it, and by removing a portion thereof by an excimer laser, if necessary, and wherein the deficiency defect can easily be modified by using a similar means with respect to a positive type material and a negative type material.

What is claimed is:

1. A method of modifying conductive lines of an electronic circuit board comprising the steps of:

removing an insulating layer covering a predetermined connection portion between conductive lines by applying a first laser beam to the predetermined connection portion;

supplying a liquid material for connecting the conductive lines; and heating the liquid material by using a second laser beam, thereby forming a solid metal layer which connects the conductive lines.

2. The method according to claim 1, wherein the step of supplying a liquid material is performed by a micro-dispenser.

3. The method of modifying conductive lines of an electronic circuit board according to claim 1, wherein, after the connecting portion of the conductive lines has been connected by the metal layer, a liquid material for protecting the connecting portion is supplied on the metal layer and is cured thereby recoating the metal layer.

4. The method of modifying conductive lines of an electronic circuit board according to claim 3, wherein the liquid material for connecting the conductive lines employs a dispersed liquid of ultra-fine particles in which either one selected from the group consisting of a metal paste, a metal complex and ultra-fine particles of a metal is or are dispersed in a solvent.

5. The method of modifying conductive lines of an electronic circuit board according to claim 3, wherein the liquid material for protecting the connecting portion of the conductive lines employs a material of a heat resistant organic protection layer.

6. A method of modifying conductive portions of an electronic circuit board in order to correct a defect, comprising the following steps:

supplying a liquid material for connecting conductive portions of an electronic circuit board together, wherein the liquid material is supplied by a micro-dispenser; and heating the liquid material by using a laser beam, thereby forming a solid metal layer which connects the conductive portions together.

7. A method of modifying conductive portions of an electronic circuit board according to claim 6, wherein the liquid material employs a dispersed liquid of ultra-fine particles in which any one selected from the group consisting of a metal paste, a metal complex, and ultra-fine particles of a metal is or are dispersed in a solvent.

* * * * *